United States Patent
Elkholy et al.

(10) Patent No.: US 12,407,356 B2
(45) Date of Patent: Sep. 2, 2025

(54) SYSTEM AND METHOD FOR TRANSITION AWARE BINARY SWITCHING FOR DIGITAL-TO-ANALOG CONVERTERS (DACs)

(71) Applicant: Avago Technologies International Sales Pte. Limited, Singapore (SG)

(72) Inventors: Ahmed Elkholy, Irvine, CA (US); Adesh Garg, Aliso Viejo, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 196 days.

(21) Appl. No.: 18/465,582

(22) Filed: Sep. 12, 2023

(65) Prior Publication Data

US 2025/0088196 A1    Mar. 13, 2025

(51) Int. Cl.
   *H03M 1/06* (2006.01)
   *H03M 1/08* (2006.01)
   *H03M 1/66* (2006.01)

(52) U.S. Cl.
   CPC ....... *H03M 1/0604* (2013.01); *H03M 1/0639* (2013.01); *H03M 1/067* (2013.01); *H03M 1/0845* (2013.01); *H03M 1/66* (2013.01)

(58) Field of Classification Search
   CPC ...... H03M 1/0604; H03M 1/66; H03M 1/067; H03M 1/0845; H03M 1/0639
   USPC .......................................... 341/118, 131, 144
   See application file for complete search history.

(56) References Cited

U.S. PATENT DOCUMENTS 9,124,287 B1 *  9/2015  Ho .......................... H03M 1/109
10,069,505 B1 *  9/2018  Poulton ............... H03M 1/0641

* cited by examiner

*Primary Examiner* — Khai M Nguyen
(74) *Attorney, Agent, or Firm* — Foley & Lardner LLP

(57) ABSTRACT

A system may have a multiplexer and a controller. For a transition from a first pair of bits in first data provided to digital-to-analog converters (DACs) to a second pair of bits in second data, the controller may determine whether the transition is of a first type or of a second type, and in response to determining that the transition is of the first type, control the multiplexer to output the second pair of bits to the DACs. In response to determining that the transition is of the second type and the second pair of bits are to be swapped, the controller may control the multiplexer to output a swapped pair of bits to the DACs. Data output by the multiplexer based on the second data has a predetermined number of bits that have binary values different from those of corresponding bits in the first data.

20 Claims, 12 Drawing Sheets a
SYSTEM AND METHOD FOR TRANSITION AWARE BINARY SWITCHING FOR DIGITAL-TO-ANALOG CONVERTERS (DACs)

FIELD OF THE DISCLOSURE

This disclosure generally relates to systems and methods for applications using digital-to-analog converters (DACs), and more particularly to randomizing digital signals in DACs while reducing random switching.

BACKGROUND

There are many applications using DACs. Such applications include radio frequency (RF) DAC applications for Wi-Fi and 5G base stations, serializer/deserializer (SerDes) applications, optical applications, and so on. In DACs, there may exist strong signal dependence that can make amplitude and/or timing errors of digital signals and supply modulation show up as distortion and limit a spurious-free dynamic range (SFDR).

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
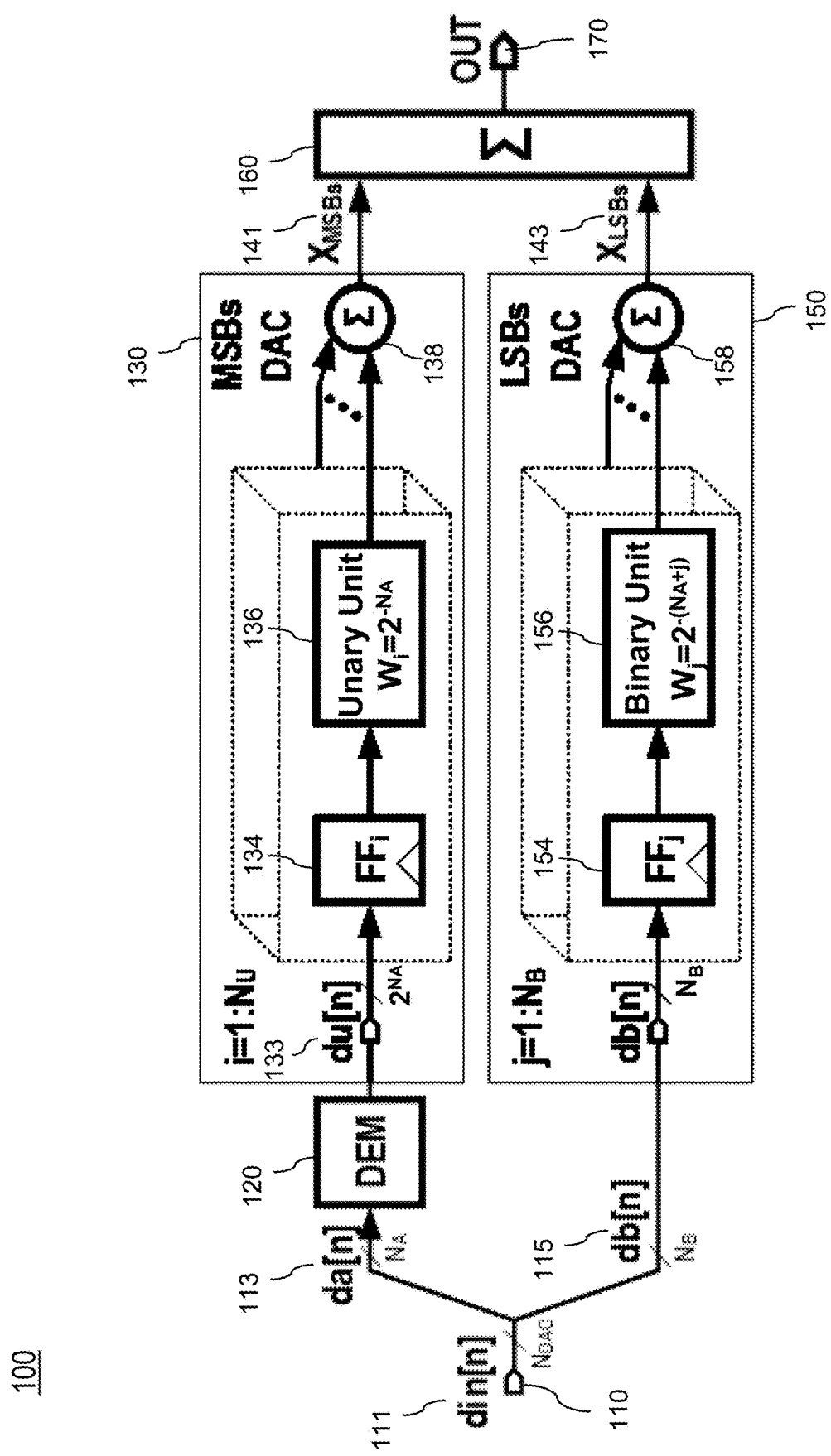
FIG. 1 is a schematic block diagram of an example DAC including dynamic element matching (DEM) circuitry.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, a first feature in communication with or communicatively coupled to a second feature in the description that follows may include embodiments in which the first feature is in direct communication with or directly coupled to the second feature and may also include embodiments in which additional features may intervene between the first and second features, such that the first feature is in indirect communication with or indirectly coupled to the second feature. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a system including a multiplexer and a controller. In some embodiments, the multiplexer (or MUX) may be data selector circuitry, programmable logic devices, or any device or circuitry that selects between one or more analog or digital input signals and forward the selected one or more input signals to one or more output lines. In some embodiments, circuitry may be one or more circuits, one or more hardware components, a combination of hardware and firmware, a combination of hardware and software, or a combination of hardware, firmware and software. In some embodiments, the controller may be one or more processors, programmable logic devices, microprocessor units, special purpose processors, a combination of hardware, firmware, and/or software, or any logic circuitry that include one or more logic gates, receive one or more analog or digital input signals, perform one or more logic operation, and/or provide one or more analog or digital output signal. The multiplexer may be configured to output, at a first time, a first pair of a first digital value and a first dither value. In some embodiments, a digital value may be a value indicated by a digital signal, a digital number that can be represented in a digit-based numbering system. In some embodiments, a dither value may be a value indicated by a randomly (or pseudo-randomly) generated digital or analog signal, or a value indicated by any digital or analog signal that is randomly (or pseudo-randomly) generated to randomize errors (e.g., quantization errors) and/or remove data dependency. The multiplexer may be configured to receive, at a second time subsequent to the first time, a second pair of a second digital value and a second dither value. The controller may be coupled to the multiplexer and configured to compare the first pair and the second pair. The controller may be configured to control, based on a result of the comparing, the multiplexer to swap one or more bits of the second digital value with one or more bits of the second dither value. In some embodiments, swapping a first bit of a first value with a second bit of a second value may include swapping or exchanging a value of the first bit with a value of the second bit, or copying or moving or storing (1) a value of the first bit to the second bit and (2) a value of the second bit to the first bit. The swapped one or more bits of the second digital value may be provided as an input to one or more digital-analog-converters (DACs). In some embodiments, the one or more DACs may include one or more binary-weighted DACs, cyclic DACs, thermometer-coded DACs, or hybrid (segmented) DACs.

In some embodiments, the swapped one or more bits of the second dither value may be provided as an input to one or more DACs that are different from the one or more DACs to which the swapped one or more bits of the second digital value are provided.

In some embodiments, in comparing the first pair and the second pair, the controller may be configured to compare, for each bit of a plurality of bits of the second digital value, a first value and a second value as a second comparison. The first value may include a binary value of the first digital value and a binary value of the first dither value that correspond to said each bit. The second value may include a binary value of the second digital value and a binary value of the second dither value that correspond to said each bit. The controller may be configured to determine, based on a result of the second comparison, among the plurality of bits of the second digital value, a group of bits of the second digital value that are optionally to be swapped with corresponding bits of the second dither value. The controller may be configured to determine, based on the result of the second comparison and a predetermined quantity, among the group of bits of the second digital value, a first quantity of one or more bits that are to be swapped with one or more bits of the second dither value.

In some embodiments, the controller may be configured to determine, based on the first quantity, the one or more bits of the second digital value swapped with the one or more bits of the second dither value. The predetermined quantity may be equal to the number of the plurality of bits of the second digital value. The controller may be configured to determine the one or more bits of the second digital value swapped with the one or more bits of the second dither value by randomly selecting, from among the group of bits of the second digital value, one or more bits according to the first quantity.

In some embodiments, the system may include first circuitry and second circuitry. The first circuitry (e.g., dither generator) may be configured to randomly generate the second dither value. In some embodiments, the dither generator may include one or more devices or circuitry that can generate random numbers, pseudorandom numbers, random patterns, pseudorandom patterns, random noise, pseudorandom noise, random digital sequences, or pseudorandom digital sequences including pseudorandom binary sequences. The second circuitry (e.g., subtractor circuitry) may be configured to receive input data, and generate the second digital value by subtracting the second dither value from the input data. The subtractor circuitry may be one or more processors, one or more programmable logic devices, or any device or circuitry that includes logic gates for subtraction, and/or performs subtraction of digital numbers.

Various embodiments disclosed herein are related to a method. The method may include outputting, by a multiplexer at a first time, a first pair of a first digital value and a first dither value. The method may include receiving, by the multiplexer at a second time subsequent to the first time, a second pair of a second digital value and a second dither value. The method may include comparing, by a controller coupled to the multiplexer, the first pair and the second pair. The method may include controlling, by the controller based on a result of the comparing. The multiplexer to swap one or more bits of the second digital value with one or more bits of the second dither value. The swapped one or more bits of the second digital value may be provided as an input to one or more digital-analog-converters (DACs).

In some embodiments, the swapped one or more bits of the second dither value may be provided as an input to one or more DACs that are different from the one or more DACs to which the swapped one or more bits of the second digital value are provided.

In some embodiments, in comparing the first pair and the second pair, the controller may compare, for each bit of a plurality of bits of the second digital value, a first value and a second value as a second comparison. The first value may include a binary value of the first digital value and a binary value of the first dither value that correspond to said each bit. The second value may include a binary value of the second digital value and a binary value of the second dither value that correspond to said each bit. The controller may determine, based on a result of the second comparison, among the plurality of bits of the second digital value, a group of bits of the second digital value that are optionally to be swapped with corresponding bits of the second dither value. The controller may determine, based on the result of the second comparison and a predetermined quantity, among the group of bits of the second digital value, a first quantity of one or more bits that are to be swapped with one or more bits of the second dither value.

In some embodiments, the controller may determine, based on the first quantity, the one or more bits of the second digital value swapped with the one or more bits of the second dither value. The predetermined quantity may be equal to the number of the plurality of bits of the second digital value. The controller may determine the one or more bits of the second digital value swapped with the one or more bits of the second dither value by randomly selecting, from among the group of bits of the second digital value, one or more bits according to the first quantity.

In some embodiments, the second dither value may be randomly generated. Input data may be received. The second digital value may be generated by subtracting the second dither value from the input data.

Various embodiments disclosed herein are related to a device including a multiplexer and a controller. The multiplexer may be coupled to a first plurality of digital-analog-converters (DACs) and a second plurality of DACs. The multiplexer may be configured to output, at a first time, a first pair of a first digital value and a first dither value, which are respectively provided to the first plurality of DACs and the second plurality of DACs. The multiplexer may be configured to receive, at a second time subsequent to the first time, a second pair of a second digital value and a second dither value. The controller may be coupled to the multiplexer and configured to compare the first pair and the second pair. The controller may be configured to control, based on a result of the comparing, the multiplexer to swap one or more bits of the second digital value with one or more bits of the second dither value. The swapped one or more bits of the second digital value may be provided as an input to the second plurality of DACs. The swapped one or more bits of the second dither value may be provided as an input to the first plurality of DACs.

In some embodiments, in comparing the first pair and the second pair, the controller may be configured to compare, for each bit of a plurality of bits of the second digital value, a first value and a second value as a second comparison. The first value may include a binary value of the first digital value and a binary value of the first dither value that correspond to said each bit. The second value may include a binary value of the second digital value and a binary value of the second dither value that correspond to said each bit. The controller may be configured to determine, based on a result of the second comparison, among the plurality of bits of the second digital value, a group of bits of the second digital value that are optionally to be swapped with corresponding bits of the second dither value. The controller may be configured to determine, based on the result of the second comparison and a predetermined quantity, among the group of bits of the second digital value, a first quantity of one or more bits that are to be swapped with one or more bits of the second dither value.

In some embodiments, the controller may be configured to determine, based on the first quantity, the one or more bits of the second digital value swapped with the one or more bits of the second dither value. The predetermined quantity may be equal to the number of the plurality of bits of the second digital value. The controller may be configured to determine the one or more bits of the second digital value swapped with the one or more bits of the second dither value by randomly selecting, from among the group of bits of the second digital value, one or more bits according to the first quantity.

In some embodiments, the device may further include first circuitry and second circuitry. The first circuitry may be configured to randomly generate the second dither value. The second circuitry may be configured to receive input data, and generate the second digital value by subtracting the second dither value from the input data.

FIG. 1 is a schematic block diagram of an example DAC 100 including dynamic element matching (DEM) circuitry 120. The DAC 100 may be segmented into an MSBs (most significant bits) DAC 130 and an LSBs (least significant bits) DAC 150. The MSBs DAC 130 may include a plurality of unary (DAC) units 136 configured to receive thermometer (unary) signals as input. The LSBs DAC 150 may include a plurality of binary (DAC) units 156 configured to receive binary signals as input.

Referring to FIG. 1, the DAC 100 may receive, at an input terminal 110, an $n^{th}$ (binary) digital signal din[n] 111 with $N_{DAC}$ bits (n is an integer index of discrete-time signals), divide the digital signal din[n] 111 into a (binary) digital signal da[n] 113 with $N_A$ MSBs and a (binary) digital signal db[n] 115 with $N_B$ LSBs. The digital signal da[n] 113 with $N_A$ MSBs may be provided to the DEM circuitry 120 which can reduce mismatch between DAC reference levels and output a unary digital signal du[n] 133 with $2^{N_A}$ bits. Each bit of the unary digital signal du[n] 133 may be provided to a corresponding unary unit $W_i$ via a corresponding flip-flop $FF_i$ 134 (i is an integer such that $1 \leq i \leq N_U$). The plurality of unary units 136 may output respective analog signals which are added or summed via adder circuitry 138 (e.g., analog adder) to generate an MSBs analog signal $X_{MSBs}$ 141. Each bit of the binary digital signal db[n] 115 may be provided to a corresponding binary unit $W_j$ via a corresponding flip-flop $FF_j$ 154 (j is an integer such that $1 \leq j \leq N_B$). The plurality of binary units 156 may output respective analog signals which are added or summed via adder circuitry (e.g., analog adder) 158 to generate an LSBs analog signal $X_{LSBs}$ 143. Finally, adder circuitry (e.g., analog adder) 160 may add the signal $X_{MSBs}$ 141 and the signal $X_{MSBs}$ 143 to generate an analog output signal at an output terminal 170.

In one aspect, DACs may use segmentation (e.g., segmentation into the MSBs DAC 130 and the LSBs DAC 150 in FIG. 1) to help manage various error sources which can limit a spurious-free dynamic range (SFDR) due to amplitude/timing error and supply modulation. The tradeoff between area, power, efficiency and/or performance may be a factor on determining such segmentation. For example, the larger the portion of unary bits (e.g., unary MSBs) within an N-bit DAC becomes, the more DEM randomization techniques can be used to mitigate the impact of unary MSBs' non-idealities on SFDR. A large number of unary bits, however, can increase the backend of the DAC substantially, thereby increasing the area and power. For example, a 7U7B segmentation (e.g., $N_A=7$ and $N_B=7$ in FIG. 1) may result in 127 unary units or cells (e.g., $N_U=(2^{N_A}-1)=(2^7-1)$) unary units in FIG. 1) and 7 binary units (e.g., $N_B=7$ binary units in FIG. 1) whereas a 6U8B segmentation (e.g., NA=6 and NB=8 in FIG. 1) may result in 63 unary units or cells (e.g., $N_U=(2^{N_A}-1)=(2^6-1)$ unary units in FIG. 1) and 8 binary units (e.g., $N_B=8$ binary units in FIG. 1). The scaling on a low speed multiplexer and digital overhead associated with the unary bits can be substantial. For example, with a 16× sub-rate digital to analog interface, a 7U7B segmentation may use 2144 bits (16×(127+7) bits). While DEM techniques can de-correlate the unary bits from the signal (e.g., by making the amplitude/timing error and supply modulation show up as noise instead of distortion), the binary LSBs may still have strong signal dependence that can make LSBs' amplitude/timing error and supply modulation show up as distortion and limit SFDR, especially at low amplitudes where the unary bits are not fully utilized.

To solve this problem, according to certain aspects, embodiments in the present disclosure relate to techniques for randomizing LSBs code (e.g., binary value) to make the LSBs code data independent. In some embodiments, a system (e.g., DAC system) may generate a random dither signal and randomize LSBs code by subtracting, from an input digital signal, the random dither signal in the digital domain and adding an auxiliary dither DAC. In some embodiments, a dither signal may be added to an input digital signal in the digital domain, and subtracted in the analog domain. In this manner, the amplitude/timing errors and supply modulation of the LSBs code can show up as noise without any limitation to SFDR and without changing a desired output. An example DAC configured to randomize LSBs code using dither signals is shown in FIG. 2.

Figure 2:
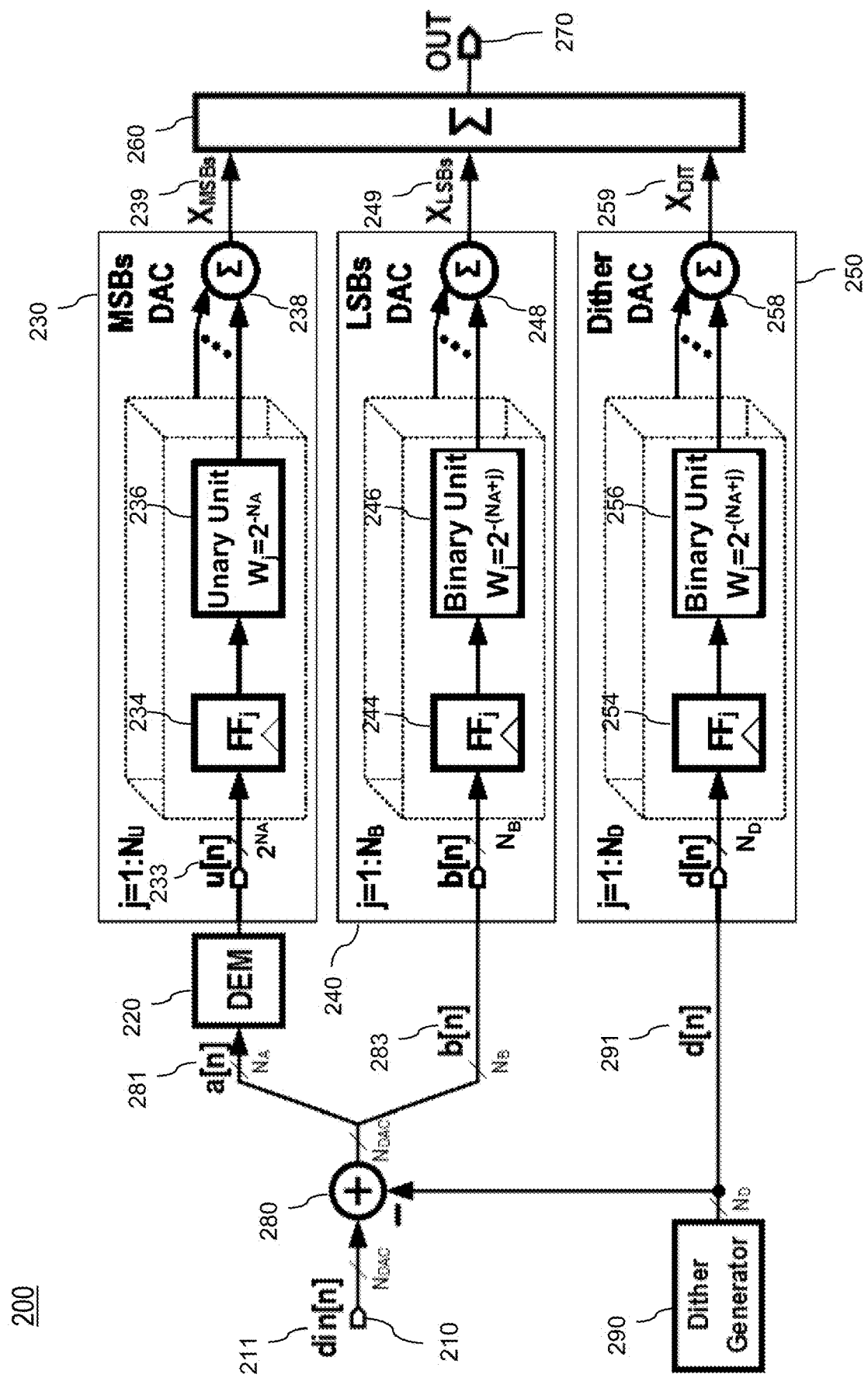
FIG. 2 is a schematic block diagram of an example DAC including a dither generator, according to an embodiment.

FIG. 2 is a schematic block diagram of an example DAC 200 including a dither generator 290, according to an embodiment. In some embodiments, the dither generator 290 may generate a (binary) dither signal 291 with $N_D$ bits. The DAC 200 may be segmented into an MSBs DAC 230, an LSBs DAC 240 and a dither DAC 250. The MSBs DAC 230 may include a plurality of unary (DAC) units 236 configured to receive thermometer (unary) signals as input. The LSBs DAC 240 may include a plurality of binary (DAC) units 248 configured to receive binary signals as input. The dither DAC 250 may include a plurality of binary (DAC) units 256 configured to receive binary signals as input.

Referring to FIG. 2, the DAC 200 may receive, at an input terminal 210, an $n^{th}$ (binary) digital signal din[n] 211 with $N_{DAC}$ bits (n is an integer index of discrete-time signals), and subtract, from the digital signal din[n] 211 using subtractor circuitry 280 (e.g., digital subtractor circuitry), the dither signal 291 with $N_D$ bits that is generated by the dither generator 290. The DAC 200 may divide an output digital signal of the subtractor circuitry 280 into a (binary) digital signal a[n] 281 with $N_A$ MSBs and a (binary) digital signal b[n] 283 with $N_B$ LSBs. The digital signal a[n] 281 with $N_A$ MSBs may be provided to DEM circuitry 220 which can reduce mismatch between DAC reference levels and output a unary digital signal u[n] 233 with $2^{N_A}$ bits. Each bit of the unary digital signal u[n] 233 may be provided to a corresponding unary unit $W_i$ via a corresponding flip-flop $FF_i$ 234 (i is an integer such that $1 \leq i \leq N_U$). The plurality of unary units 236 may output respective analog signals which are added or summed via adder circuitry 238 (e.g., analog adder) to generate an MSBs analog signal $X_{MSBs}$ 239. Each bit of the binary digital signal b[n] 283 may be provided to a corresponding binary unit $W_j$ via a corresponding flip-flop $FF_j$ 244 (j is an integer such that $1 \leq i \leq N_B$). The plurality of binary units 246 may output respective analog signals which are added or summed via adder circuitry (e.g., analog adder) 248 to generate an LSBs analog signal $X_{LSBs}$ 249. Similarly, each bit of the binary digital signal d[n] 291 may be provided to a corresponding binary unit $W_j$ via a corresponding flip-flop $FF_j$ 254 (j is an integer such that $1 \leq i \leq N_D$). The plurality of binary units 256 may output respective analog signals which are added or summed via adder circuitry (e.g., analog adder) 258 to generate a dither analog signal $X_{DIT}$ 259. Finally, adder circuitry (e.g., analog adder) 260 may add the signal $X_{MSBs}$ 239, the signal $X_{LSBs}$ 249 and the signal $X_{DIT}$ 259 to generate an analog output signal at an output terminal 270.

As shown in FIG. 2, by subtracting a random dither signal (e.g., d[n] 291) in the digital domain and adding an auxiliary dither DAC (e.g., dither DAC 250), the DAC 200 can randomize LSBs code (e.g., binary digital signal b[n] 283) to make the LSBs code data independent such that the amplitude/timing errors and supply modulation of the LSBs code show up as noise without any limitation to SFDR and without changing a desired output. For example, if $N_A=N_B=N_D=7$ in FIG. 2, randomization using dither signals can be performed using the following equation:

$$\sum_{i=0}^{13} 2^i \cdot \text{data}_i(n) = \qquad \text{(Equation 1)}$$
$$\sum_{i=0}^{127} 2^7 \cdot u_i(n) + \sum_{i=0}^{6} 2^i \cdot b_i(n) + \sum_{i=0}^{6} 2^i \cdot d_i(n)$$

where $\text{data}_i(n)$ denotes a value of $i^{th}$ bit of din[n]; $u_i(n)$ denotes a value of $i^{th}$ bit of u[n]; $b_i(n)$ denotes a value of $i^{th}$ bit of b[n]; and $d_i(n)$ denotes a value of $i^{th}$ bit of d[n].

Generally, if $N_B=N_D$, randomization using dither signals can be performed using the following equation:

$$\sum_{i=0}^{N_A+N_B-1} 2^i \cdot \text{data}_i(n) = \qquad \text{(Equation 2)}$$
$$\sum_{i=0}^{2^{N_A}-1} 2^{N_A} \cdot u_i(n) + \sum_{i=0}^{N_B-1} 2^i \cdot b_i(n) + \sum_{i=0}^{N_D-1} 2^i \cdot d_i(n)$$

where $N_A$ denotes a number of MSBs; $N_B$ denotes a number of LSBs; and $N_D$ denotes a number of bits of a dither signal.

In one aspect, although such randomization using dither signals can reduce the amplitude/timing errors and supply modulation of the LSBs code, the randomization can increase random switching (e.g., random switching between binary values "0" and "1") onto the supply of a pre-driver (PreDrv) which modulates clock signals (CLK) and the supply of a driver (Drv) which modulates reference voltages (REF). Supply modulation of both the pre-driver and the driver can modulate a carrier frequency (Fsig). The increased random switching onto the supply modulation of both the pre-driver and the driver can show up as skirts, and increase the in-band noise floor which is undesirable and a critical limitation for radio frequency (RF) applications especially at a high carrier frequency (Fsig).

To solve this problem, according to certain aspects, embodiments in the present disclosure relate to techniques for determining (or choosing) the arbitrary or random dither signal such that the number of switching (e.g., switching between binary values "0" and "1") for a given input digital data is equal to (or substantially equal to) a constant. In some embodiments, for a given $n^{th}$ digital signal din[n] (e.g., din[n] 211 in FIG. 2), if $N_B=N_D=7$ in FIG. 2, a system (e.g., DAC) can generate a digital signal b[n] and a dither signal d[n] to satisfy an extra constraint as follows:

$$ntrnB(n) = \qquad \text{(Equation 3)}$$
$$\sum_{i=0}^{6} |b_i(n) - b_i(n-1)| + \sum_{i=0}^{6} |d_i(n) - d_i(n-1)| = \text{constant}$$

where ntrnB(n) denotes a number of binary transitions for converting the given $n^{th}$ digital signal din[n]; $b_i(n)$ denotes a value of $i^{th}$ bit of b[n] for the $n^{th}$ digital signal din[n]; $b_i(n-1)$ denotes a value of $i^{th}$ bit of b[n−1] for the $(n-1)^{th}$ digital signal din[n−1]; $d_i(n)$ denotes a value of $i^{th}$ bit of d[n]; and $d_i(n-1)$ denotes a value of $i^{th}$ bit of d[n−1] for the $(n-1)^{th}$ digital signal din[n−1]. In some embodiments, the $n^{th}$ digital signal din[n] may be received or inputted subsequent to (or immediately after) receipt or input of the $(n-1)^{th}$ digital signal din[n−1]. In some embodiments, there may be no digital signal din that is received after the receipt of the $(n-1)^{th}$ digital signal din[n−1] and before the receipt of the $n^{th}$ digital signal din[n].

Generally, if $N_B=N_D$, a number of binary transitions for converting a given $n^{th}$ digital signal din[n] is given as follows:

$$ntrnB(n) = \sum_{i=0}^{N_B-1} |b_i(n) - \qquad \text{(Equation 4)}$$
$$b_i(n-1)| + \sum_{i=0}^{N_D-1} |d_i(n) - d_i(n-1)| = \text{constant}$$

where $N_B$ denotes a number of LSBs; and $N_D$ denotes a number of bits of a dither signal. In the following descriptions, it is assumed that $N_B=N_D=7$ for example; however embodiments of the present disclosure are not limited thereto and $N_B=N_D$ can be any integer greater than or equal to 1.

By determining (or choosing) a digital signal b[n] and a dither signal d[n] to satisfy Equation 3 (or Equation 4), the system can realize a binary constant transition rate (BCTR), thereby effectively eliminating all the switching noise on the supply of pre-driver (PreDrv) circuitry ($FF_j$ 234, 244, 254) and the supply of DAC driver (Drv) circuitry (236, 246, 256). In other words, keeping a constant number of switching in the digital signal b[n] and the dither signal d[n] can avoid modulation of clock signals (CLK) and modulation of reference voltages or currents (REF).

In some embodiments, if all bits of a dither signal (denoted by $DIT_i$) are active have random values, each of 14 bits including all bits of a LSBs digital signal (denoted by $LSB_i$) and $DIT_i$ may have 50% value density (see Equation 5 and Equation 7) and 50% transition density (see Equation 6 and Equation 8) as follows:

$$\overline{b_i(n)} \approx 0.5, \quad \text{(Equation 5)}$$

$$\overline{|b_i(n) - b_i(n-1)|} \approx 0.5, \quad \text{(Equation 6)}$$

$$\overline{d_i(n)} \approx 0.5, \quad \text{(Equation 7)}$$

$$\overline{|d_i(n) - d_i(n-1)|} \approx 0.5, \quad \text{(Equation 8)}$$

where $\overline{b_i(n)}$ denotes an average value of an $i^{th}$ bit of the LSBs digital signal; $\overline{d_i(n)}$ denotes an average value of an $i^{th}$ bit of the dither signal; $\overline{|b_i(n)-b_i(n-1)|}$ denotes an average number of transitions (e.g., transition between "0" and "1") of the LSBs digital signal; and $\overline{|d_i(n)-d_i(n-1)|}$ denotes an average number of transitions (e.g., transition between "0" and "1") of the dither signal.

Therefore, an average binary transition rate $\mu_{ntrnB}$ at every sample n is given as follows:

$$\mu_{ntrnB} = \overline{ntrnB(n)} \approx 7 \quad \text{(Equation 9)}$$

In some embodiments, a system (e.g., DAC) may reduce a deviation of binary transition rate $\sigma_{ntrnB}$ as much as possible such that ideally ntrnB(n)=7 at every sample n, achieving a binary constant transition rate (BCTR). In some embodiments, a system with a BCTR can alleviate the switching activity impact of DAC binary bits, which can shape and limit the DAC performance. Moreover, a system with a BCTR can relax the segmentation requirements of a DAC, thereby reducing DAC power consumption and occupied area.

In some embodiments, a DAC may receive, at an input terminal, an $n^{th}$ (binary) data signal with 14 bits, and subtract, from the data signal using subtractor circuitry (e.g., digital subtractor circuitry), a (binary) dither signal dd with 7 bits that is generated by a dither generator. In some embodiments, the dither generator may generate a dither signal with a reduced number of bits using a dither mask signal and/or a dither mask register (e.g., 7 bit register). The DAC may divide an output digital signal of the subtractor circuitry into a (binary) MSBs signal with 7 MSBs and a (binary) LSBs signal db with 7 LSBs. The MSBs signal may be provided to DEM circuitry which can output a unary digital signal du with 127 bits which may be provided to one or more MSBs DACs. The DAC may include a multiplexer configured to receive the LSBs signal db and the dither signal dd as input and output a (binary) MUX output LSBs signal dbx and a (binary) MUX output dither signal ddx. The DAC may include a BCTR controller configured to receive the LSBs signal db, the dither signal dd, the MUX output LSBs signal dbx and the MUX output dither signal ddx, and provide a swap control signal (swap_ctrl$_i$) to the multiplexer. The MUX output LSBs signal dbx may be provided to one or more LSBs DACs, and the MUX output dither signal ddx may be provided to one or more dither DACs.

In some embodiments, the system may use a swap control signal swap_ctrl$_i$ to control a multiplexer (e.g., multiplexer or MUX 580 in FIG. 5) For example, when swap_ctrl$_i$=0, the multiplexer may pass the $i^{th}$ bits of an input (LSB, DIT) pair, e.g., $\{d_i(n), dd_i(n)\}$ pair, "as is" to generate the $i^{th}$ bits of an output pair, e.g., $\{dbx_i(n), ddx_i(n)\}$ pair, such that $dbx_i(n)=db_i(n)$ and $ddx_i(n)=dd_i(n)$). On the other hand, when swap_ctrl$_i$=1, the multiplexer may swap the $i^{th}$ bits of an input $\{db_i(n), dd_i(n)\}$ pair to generate the $i^{th}$ bits of an output $\{dbx_i(n), ddx_i(n)\}$ pair such that the $dbx_i(n)=dd_i(n)$ and $ddx_i(n)=db_i(n)$).

In some embodiments, because LSB$_i$ and DIT$_i$ are equivalent, the multiplexer can swap LSB$_i$ and DIT$_i$, thereby achieving a BCTR. In some embodiments, a BCTR controller may determine whether to pass b$_i$ and d$_i$ "as is" (by setting swap_ctrl$_i$=0) or swap b$_i$ and d$_i$, (by setting swap_ctrl$_i$=1) based on a value of a pair of $\{b_i, d_i\}$ as shown in Table 1.

TABLE 1

Passing or swapping bits based on degree of freedom

| $\{b_i, d_i\}$ | val$_i$ | $\{bx_i, dx_i\}$ | Comment |
| --- | --- | --- | --- |
| 00 | 0 | 00 | passed "as is", no degree of freedom; FORCED |
| 11 | 2 | 11 | passed "as is", no degree of freedom; FORCED |
| 01 | 1 | 01 or 10 | can be passed "as is" or "swapped"; Programmable |
| 10 | 1 | 10 or 01 | can be passed "as is" or "swapped"; Programmable |

In Table 1, if the value of the pair of $\{b_i, d_i\}$ is "00" or "11", the BCTR controller may determine to pass b$_i$ and d$_i$ "as is" because there is no degree of freedom (e.g., no reason to swap b$_i$ and d$_i$). Thus, this case ("00" or "11") may be referred to as a "forced" (F) transition. On the other hand, if the value of the pair of $\{b_i, d_i\}$ is "01" or "10", the BCTR controller may determine to either pass b$_i$ and d$_i$ "as is" or swap b$_i$ and d$_i$, because there is a degree of freedom (e.g., b$_i$ and d$_i$ can be swapped based on equivalence between LSB$_i$ and DIT$_i$). Thus, this case ("01" or "01") may be referred to as a "programmable" (P) transition. In some embodiments, the BCTR controller may calculate a value val$_i$ by adding the values of b$_i$ and d$_i$ and determine whether the case is a "forced" (F) transition or a "programmable" (P) transition. For example, if the value of the pair of $\{b_i, d_i\}$ is "00" or "11", val$_i$ will be an even number (0 or 2) and the BCTR controller may determine that these cases are F transitions because there is no degree of freedom. On the other hand, if (1) the value of the pair of $\{b_i, d_i\}$ is "01" or "10" and (2) the value of the pair of $\{bx_i, dx_i\}$ is "01" or "10" (e.g., both val$_i$ for $\{b_i, d_i\}$ and val$_i$ for $\{bx_i, dx_i\}$ are odd numbers), the BCTR controller may determine that these cases are P transitions because there is a degree of freedom.

In some embodiments, if the pair of $\{b_i, d_i\}$ has a degree of freedom (e.g., val$_i$=1), the BCTR controller may control the multiplexer to increase or decrease the binary switching or transitions (e.g., increase or decrease the number of binary transitions between "0" and "1" in LSB$_i$ and DIT$_i$) to realize a BCTR. For example, the BCTR controller may reduce a deviation of the number of binary transitions in LSB$_i$ and DIT$_i$ such that the actual number of binary transitions is substantially the same as an average number of binary transition (e.g., 7 according to Equation 9) using the following equation:

$$ntrnB(n) = \quad \text{(Equation 10)}$$

$$\sum_{i=0}^{6} |bx_i(n) - bx_i(n-1)| + \sum_{i=0}^{6} |dx_i(n) - dx_i(n-1)| \approx 7$$

where the term $$ntrnB(n) = \quad \text{(Equation 10)}$$

$$\sum_{i=0}^{6} |bx_i(n) - bx_i(n-1)| + \sum_{i=0}^{6} |dx_i(n) - dx_i(n-1)| \approx 7$$

indicates the number of binary transitions (switching) in an LSBs signal (LSB$_i$), and the term $$\sum_{i=0}^{6} |dx_i(n) - dx_i(n-1)|$$

indicates the number of binary transitions (switching) in a dither signal (DIT$_i$).

In some embodiments, a system can achieve a BCTR (or implement a BCTR scheme) by keeping a dither generator and a MSBs path (e.g., DEM circuitry and MSBs DAC) as they are and just adding a multiplexer and a BCTR (switching) controller. In this manner, the dither generator, the MSBs path, the multiplexer and the BCTR controller can operate in parallel without adding any latency, and the system aching the BCTR can be implemented in a simple, low-overhead and practical manner.

In some embodiments, a system can achieve a BCTR (or implement a BCTR scheme) using state transitions between pairs of $\{bx_i, dx_i\}$ as represented in a state transition diagram. Each $\{bx_i(n), dx_i(n)\}$ pair may have 4 states (e.g., "00", "01", "10", "11"), and the transition or switching may depend on the previous state $\{bx_i(n-1), dx_i(n-1)\}$. Thus, there may be 16 transition possibilities out of which (1) 12 transitions possibilities have no degree of freedom (12 forced transitions) and (2) 4 transitions possibilities (when val$_i(n)=1$ and val$_i(n-1)=1$) have a degree of freedom (4 programmable transitions).

In some embodiments, the system may use a variable sw$_i$ to represent the number of transitions that may occur for i$^{th}$ bits of $\{bx_i(n), dx_i(n)\}$ pair. In some embodiments, sw$_i=0$ indicates that no transitions occur and i$^{th}$ bits of $\{bx_i(n), dx_i(n)\}$ pair have the same state (or values) as the previous sample (e.g., $\{bx_i(n-1), dx_i(n-1)\}$); sw$_i=1$ indicates that only one of the i$^{th}$ bits of the $\{bx_i(n), dx_i(n)\}$ pair has changed its state (or values) from the previous sample; or sw$_i=2$ indicates that both the i$^{th}$ bits of the $\{bx_i(n), dx_i(n)\}$ pair has changed their state (or values) from the previous sample. See FIG. 6 which show example values of sw$_i$. For example, the system may set sw$_i$ to 0 if no transitions occurs (e.g., "00" to "00"), set sw$_i$ to 1 if only 1 bit has changed its state (e.g., "00" to "10"), and set sw$_i$ to 2 if both bits have changed their states (e.g., "00" to "11"). For 4 programmable transitions (when val$_i(n)=1$ and val$_i(n-1)=1$), the system may set sw$_i$ to 0 or 2 (e.g., "01" to "10"). For example, if the system sets sw$_i$ to 0 for two programmable transitions and sets sw$_i$ to 2 for the other two programmable transitions, out of 16 transition possibilities, 4 transition possibilities have sw$_i=0$, 8 transition possibilities have sw$_i=1$, and 4 transition possibilities have sw$_i=2$.

In some embodiments, a system can compare a pair of $\{b_i(n), d_i(n)\}$ for the current n$^{th}$ sample and a pair of $\{b_i(n-1), d_i(n-1)\}$ for the previous (n-1)$^{th}$ sample. Based on a result of the comparison, the system can determine transition-related variables including (1) val$_i(n)$ and val$_i(n-1)$ indicating a degree of freedom of the current and previous samples, respectively; (2) transition types (forced or programmable) from the previous sample to the current sample; (3) a number of forced transitions dval$_i(n)$; and/or (4) sw$_i$ indicating a required number of transitions for i$^{th}$ bits of the pair of $\{b_i(n-1), d_i(n-1)\}$. The system may calculate a value of val$_i(n)$ by adding bit values of $b_i(n)$ and $d_i(n)$. The system may determine a transition type of i$^{th}$ bits based on val$_i(n)$ and val$_i(n-1)$. For example, if val$_i(n)$ or val$_i(n-1)$ is an even number, the system may determine that the transition type is "forced". On the other hand, if both val$_i(n)$ and val$_i(n-1)$ are odd numbers (e.g., 1), the system may determine that the transition type is "programmable". The system may calculate the number of forced transitions dval$_i(n)$ as follows:

$$dval_i(n) = |val_i(n-1) - val_i(n)| \quad \text{(Equation 11)}$$

For forced transitions, the system may set sw$_i$ to the value of dval$_i(n)$. For programmable transitions, the system may set sw$_i$ to 0 or 2. For example, given an n$^{th}$ LSBs signal=[1110100], an n$^{th}$ dither signal=[0100110], an (n-1)$^{th}$ LSBs signal=[0010100], and an (n-1)$^{th}$ dither signal=[1110100], Table 2 shows (1) val$_i(n)$ and val$_i(n-1)$; (2) transition types; (3) dval$_i(n)$; and (4) sw$_i$.

TABLE 2

| | | | Transition-related variables | | | | | |
|---|---|---|---|---|---|---|---|---|
| Bit i | $\{b_i(n), d_i(n)\}$ | val$_i(n)$ | $\{b_i(n-1), d_i(n-1)\}$ | val$_i(n-1)$ | Trans. Type | dval$_i(n)$ | sw$_i$ | swap_ctrl$_i$ |
| 0 | 00 | 0 | 01 | 1 | Forced | 1 | 1 | 0 |
| 1 | 01 | 1 | 01 | 1 | Programmable | 0 | 2 | 0 |
| 2 | 11 | 2 | 11 | 2 | Forced | 0 | 0 | 0 |
| 3 | 00 | 0 | 00 | 0 | Forced | 0 | 0 | 0 |
| 4 | 10 | 1 | 11 | 2 | Forced | 1 | 1 | 0 |
| 5 | 11 | 2 | 01 | 1 | Forced | 1 | 1 | 0 |
| 6 | 10 | 1 | 01 | 1 | Programmable | 0 | 2 | 1 |

In some embodiments, the system may perform a BCTR scheme as follows. In a first step, for a transition from a previous pair of an i$^{th}$ input data bit and an i$^{th}$ dither bit $\{b_i(n-1), d_i(n-1)\}$ to a current pair of an i$^{th}$ input data bit and an i$^{th}$ dither bit $\{b_i(n), d_i(n)\}$, a system may determine whether the transition is forced (F) or programmable (P). For example, referring to Table 2, the system may determine that the transition for bit 0 is F because val$_i(n)$ is an even number (e.g., 0); and the transition for bit 1 is P because both val$_i(n)$ and val$_i(n-1)$ are odd numbers (e.g., 1).

In a second step, for forced (F) transitions, the system may set sw$_i$ to a number of required transitions dval$_i(n)$ which can be calculated using Equation 11. For example, referring to Table 2, the system can calculate dval$_i(n)=1$ for i=0, 4, 5.

In a third step, the system may calculate a total number of F transitions (ntrnF(n)) in the current (n$^{th}$) sample as follows:

$$ntrnF(n) = \sum_{i=0}^{6} dval_i(n) = \sum_{i=0}^{6} |val_i(n) - val_i(n-1)| \quad \text{(Equation 12)}$$

For example, referring to Table 2, the system can calculate ntrnF(n)=3 by summing dval$_i(n)$.

In a fourth step, the system may calculate a required number of programmable (P) transitions with $sw_i=2$ (ntrnP(n)) in the current ($n^{th}$) sample as follows:

$$ntrnP(n) = (7 - ntrnF(n))/2 > 0 \quad \text{(Equation 13)}$$

For example, referring to Table 2, the system can calculate ntrnP(n)=(7−3)/2=2.

In a fifth step, for programmable (P) transitions, based on the required number of P transitions with $sw_i=2$ (ntrnP(n)), the system may (1) determine which P transitions (or pair of bits) are to have $sw_i=2$; and (2) set $sw_i=0$ for the rest of P transitions (or pair of bits). For example, referring to Table 2, based on ntrnP(n)=2, the system may determine which both P transitions for i=1, 6 are to have $sw_i=2$ (because there is no other P transitions, there is no P transitions that have $sw_i=0$). As shown in Table 2, the sum of $sw_i$ over i=0, . . . , 6 is 7, indicating that the number of binary transition is a constant (e.g., 7), thereby satisfying the BCTR condition (e.g., Equation 10).

Figure 6:
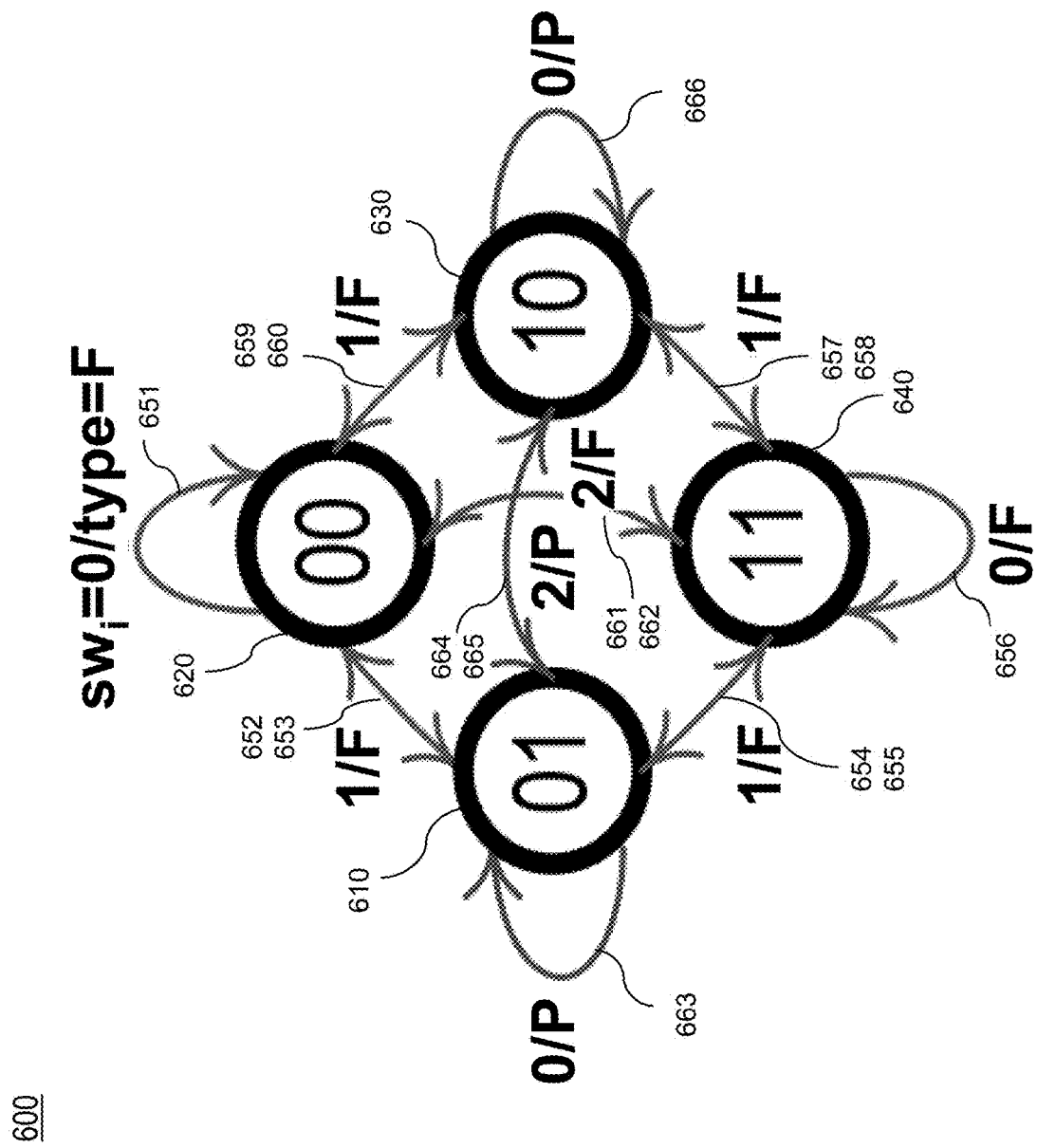
FIG. 6 is a state transition diagram showing (1) transitions between pairs of a data bit and a dither bit and (2) corresponding numbers of swaps, in accordance with an embodiment.

In a sixth step, after the system (e.g., BCTR controller) determines the transition type F or P and calculates $sw_i$, the system (e.g., BCTR controller) may set swap_ctrl$_i$ (e.g., an output signal of the BCTR controller) as follows. If a transition is forced F, then the system may set swap_ctrl$_i$=0 (regardless of $sw_i$, which can be 0, 1, or 2 as shown in FIG. 6). For example, as shown in Table 2, the system sets swap_ctrl$_i$=0 for the transitions whose type is F. If a transition is programmable P, then the system may set swap_ctrl$_i$=0 or 1 based on $sw_i$, the current sample of MUX input {db$_i$(n), dd$_i$(n)} and the previous sample of MUX output {dbx$_i$(n), ddx$_i$(n)}. For example, as shown in Table 2, when the previous sample is {0,1} and the current sample is {0,0}, the system sets swap_ctrl$_i$=0; and when the previous sample is {0,1} and the current sample is {1,0}, the system sets swap_ctrl$_i$=1.

In some embodiments, a dither generator may include a pseudorandom binary sequence generator (e.g., PRBS31 generator) to generate a binary dither signal. The PRBS31 generator may include 31 shift registers and an XOR gate which XORing taps 28 and 31. The dither generator may include an AND gate which receive a dither mask signal (or using a dither mask register) and a dither signal and output a masked dither signal.

In some embodiments, a dither generator may include a pseudorandom binary sequence generator (e.g., PRBS31 generator) and a plurality of XOR gates. Each bit of an output signal may be generated from XORing two taps from the PRBS31 generator with different spacing. In this manner, the dither generator can remove any cross-correlation while keeping the properties of the pseudorandom binary sequence generator.

Embodiments in the present disclosure have at least the following advantages and benefits. First, embodiments in the present disclosure can provide useful techniques for reducing dependency on pre-driver supply impedance by reducing random switching onto the supply modulation of both the pre-driver and the driver. The reduced random switching can reduce modulation on the reference voltage (or current) and the data deterministic jitter. Other advantages include improved effective number of bits (ENOB), reduced near-end noise spectral density (NSD), ability to lower the unary/binary segmentation boundary, improved in-band performance for RF and/or narrowband applications, and/or reduced coupling to shared power supply (since switching activity is constant and reduced).

Second, embodiments in the present disclosure can provide useful techniques for implementing logic to reduce the standard deviation of the transition density using simple hardware (e.g., multiplexer and simple BCTR controller).

Figure 3B:
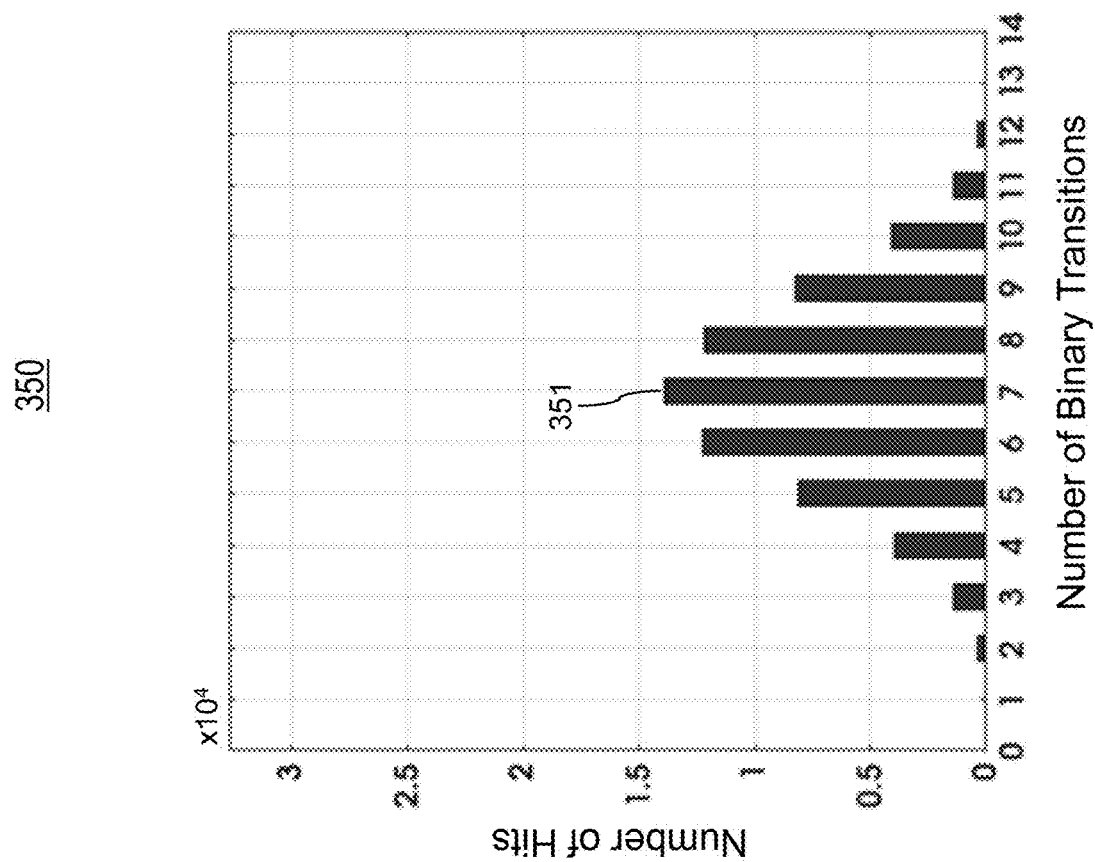
FIG. 3A and FIG. 3B are diagrams showing binary transition rates, in accordance with an embodiment.
Figure 3A:
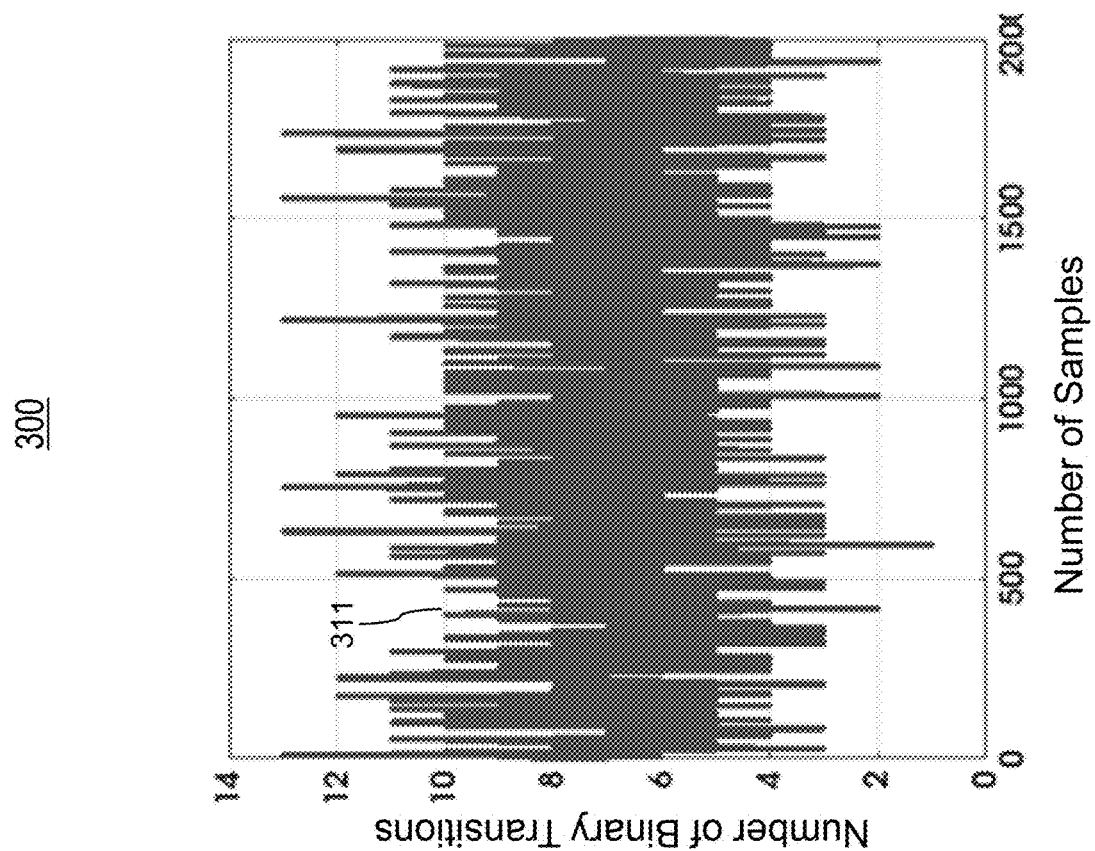

FIG. 3A and FIG. 3B are diagrams showing binary transition rates (e.g., number of binary transitions per sample), in accordance with an embodiment. FIG. 3A shows the number of binary transitions (NtrnB) 311 over different samples using a DAC configured to randomize LSBs signals using dither signals (e.g., DAC 200 in FIG. 2). FIG. 3A shows that the average of the number of binary transitions ($\mu_{NtrnB}$) and the standard deviation of the number of binary transitions ($\sigma_{NtrnB}$) are 7.01 and 1.87, respectively. FIG. 3B shows the number of hits (frequency) 351 over different numbers of binary transitions (NtrnB) using the DAC configured to randomize LSBs signals using dither signals (e.g., DAC 200 in FIG. 2). FIG. 3A and FIG. 3B shows a large standard deviation ($\sigma_{NtrnB}$=1.87) which may translate to noise on the DAC driver (Drv) and the pre-driver (PreDrv) supplies because the increased random switching onto the supply modulation of both the pre-driver and the driver can show up as skirts, and increase the in-band noise floor which is undesirable and a critical limitation for radio frequency (RF) applications especially at a high carrier frequency (Fsig). To solve this problem, in some embodiments, a system can determine (or choose) an arbitrary or random dither signal such that the number of switching (e.g., switching between binary values "0" and "1") for a given input digital data is equal to (or substantially equal to) a constant. Example systems implementing a constant number of switching (e.g., number of binary transitions) are shown in FIG. 4 to FIG. 7.

Figure 4:
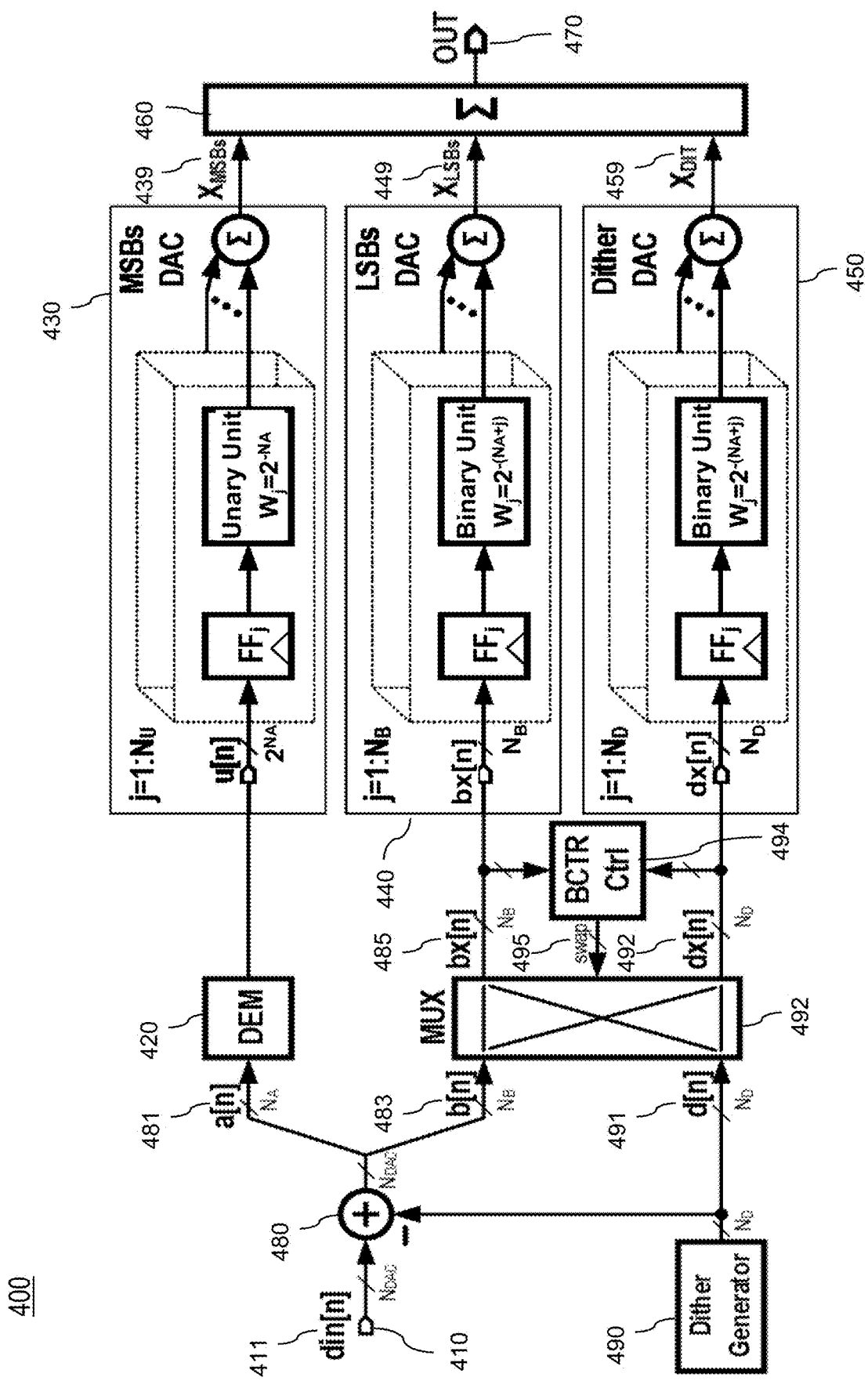
FIG. 4 is a schematic block diagram of an example DAC including a multiplexer and a binary constant transition rate (BCTR) controller, according to an embodiment.

FIG. 4 is a schematic block diagram of an example DAC 400 including a multiplexer (MUX) 492 and a binary constant transition rate (BCTR) controller 494, according to an embodiment. The DAC 400 may be segmented into an MSBs DAC 430, an LSBs DAC 440 and a dither DAC 450. The MSBs DAC 430 may have a configuration similar to the MSBs DAC 230 in FIG. 2. The LSBs DAC 440 may have a configuration similar to the LSBs DAC 240 in FIG. 2. The dither DAC 450 may have a configuration similar to the dither DAC 250 in FIG. 2. The DAC 400 may include a dither generator 490 which has a configuration similar to the dither generator 290 in FIG. 2, and DEM circuitry 420 which has a configuration similar to the DEM circuitry 220 in FIG. 2.

Referring to FIG. 4, the DAC 400 may receive, at an input terminal 410, an $n^{th}$ (binary) digital signal din[n] 411 with $N_{DAC}$ bits (n is an integer greater than or equal to 1), and subtract, from the digital signal din[n] 411 using subtractor circuitry 480 (e.g., digital subtractor circuitry), a (binary) dither signal d[n] 491 with $N_D$ bits that is generated by the dither generator 490. The DAC 400 may divide an output digital signal of the subtractor circuitry 480 into a (binary) digital signal a[n] 481 with $N_A$ MSBs and a (binary) digital signal b[n] 483 with $N_B$ LSBs. The digital signal a[n] 481 with $N_A$ MSBs may be provided to the DEM circuitry 420 which can reduce mismatch between DAC reference levels and output a unary digital signal u[n] with $2^{N_A}$ bits. The multiplexer 492 may receive the digital signal b[n] 483 and the dither signal d[n] 491 as input and output a (binary) MUX output digital signal bx[n] 485 and a (binary) MUX output dither signal dx[n] 492. The BCTR controller 494 may receive the MUX output digital signal bx[n] 485 and the MUX output dither signal dx[n] 492, and provide a swap control signal 495 (swap_ctrl$_i$) to the multiplexer 492. The MSBs DAC 430 may receive a digital signal from each bit of the unary digital signal u[n] as input, and generate an MSBs analog signal X$_{MSBs}$ 439. The LSBs DAC 440 may receive the MUX output digital signal bx[n] 485 as input, and generate an LSBs analog signal X$_{LSBs}$ 449. The dither DAC 450 may receive the MUX output dither signal dx[n] 492 as input, and generate a dither analog signal X$_{DIT}$ 459. Finally, adder circuitry (e.g., analog adder) 460 may add the signal X$_{MSBs}$ 439, the signal X$_{LSBs}$ 449 and the signal X$_{DIT}$ 459 to generate an analog output signal at an output terminal 470.

Referring to FIG. 4, the DAC 400 can use the multiplexer 492 and the BCTR controller 494 to reduce a deviation of binary transition rate σ$_{ntrnB}$ as much as possible such that ideally ntrnB(n)=7 at every sample n. In this manner, the DAC 400 can achieve a binary constant transition rate (BCTR). The DAC 400 can alleviate the switching activity impact of DAC binary bits, which can shape and limit the DAC performance. Moreover, the DAC 400 can relax the segmentation requirements of a DAC, thereby reducing DAC power consumption and occupied area. Details of the multiplexer and the BCTR controller will be described in the following sections with reference to FIG. 5 to FIG. 7.

Figure 5:
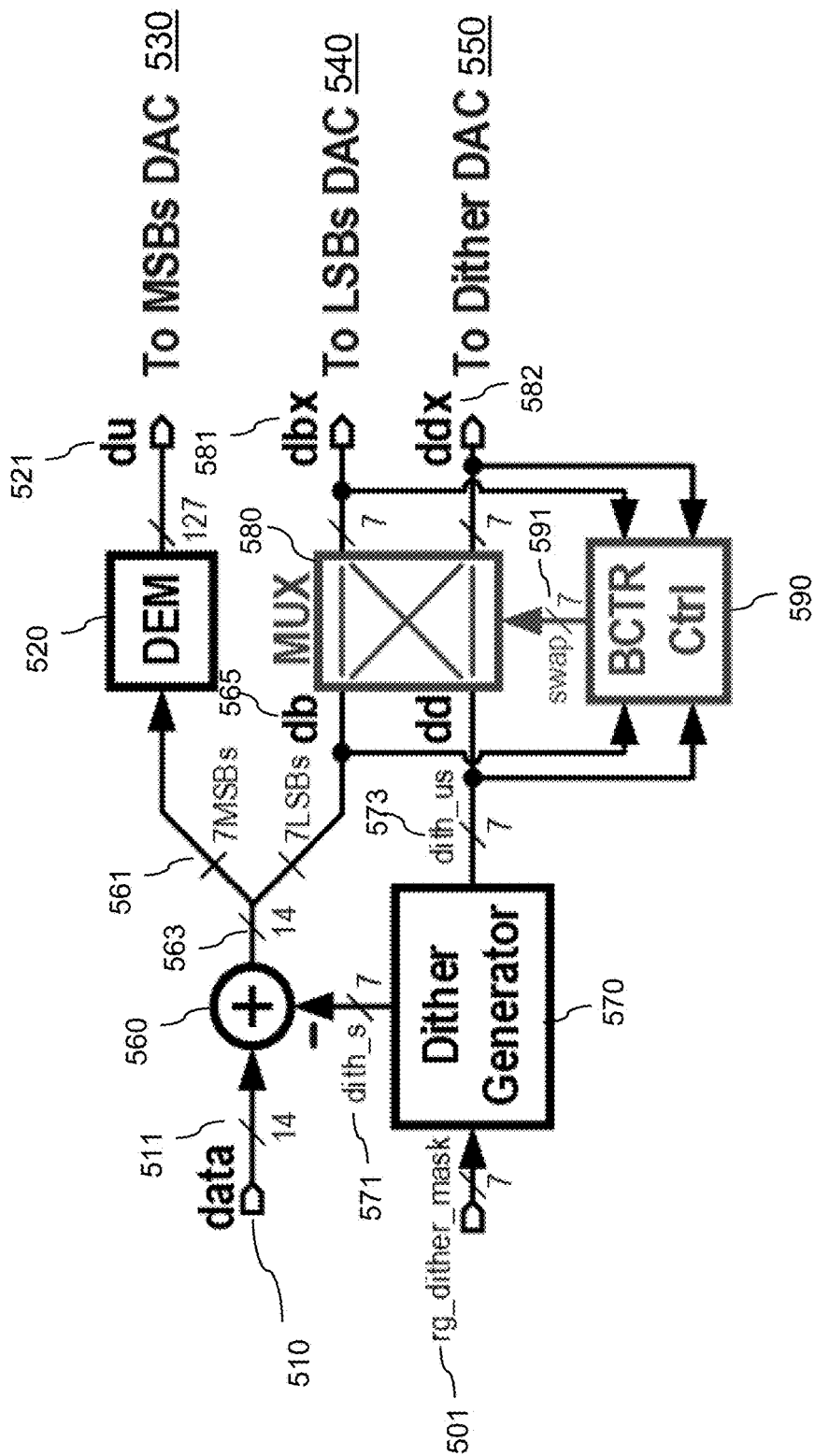
FIG. 5 is a schematic block diagram of another example DAC including a multiplexer and a BCTR controller, according to an embodiment.

FIG. 5 is a schematic block diagram of another example DAC 500 including a multiplexer 580 and a BCTR controller 590, according to an embodiment. The DAC 500 may receive, at an input terminal 510, an n$^{th}$ (binary) data signal 511 with 14 bits, and subtract, from the data signal 511 using subtractor circuitry 560 (e.g., digital subtractor circuitry), a (binary) dither signal dd 573 with 7 bits that is generated by a dither generator 570. In some embodiments, the dither generator 570 may generate the dither signal dd 573 with a reduced number of bits using a dither mask signal 501 and/or a dither mask register (e.g., 7 bit register). The DAC 500 may divide an output digital signal 563 of the subtractor circuitry into a (binary) MSBs signal 561 with 7 MSBs and a (binary) LSBs signal db 565 with 7 LSBs. The MSBs signal 561 may be provided to DEM circuitry 520 which can output a unary digital signal du 521 with 127 bits which may be provided to one or more MSBs DACs 530.

Referring to FIG. 5, the multiplexer 580 may be circuitry configured to receive the LSBs signal db 565 and the dither signal dd 573 as input, and output a (binary) MUX output LSBs signal dbx 581 and a (binary) MUX output dither signal ddx 582. The BCTR controller 590 may be circuitry configured to receive the LSBs signal db 565, the dither signal dd 573, the MUX output LSBs signal dbx 581, and the MUX output dither signal ddx 582, and provide a swap control signal 591 (swap_ctrl$_i$) to the multiplexer 580. The MUX output LSBs signal dbx 581 may be provided to one or more LSBs DACs 540, and the MUX output dither signal ddx 582 may be provided to one or more dither DACs 550. According to the swap control signal 591 (swap_ctrl$_i$), the multiplexer 580 may either (1) pass a bit (denoted by b$_i$) of the LSBs signal db "as is" and a bit (denoted by d$_i$) of the dither signal dd "as is" such that b$_i$ of the LSBs signal db is the same as a corresponding bit (denoted by bx$_i$) of the MUX output LSBs signal dbx, and d$_i$ of the dither signal dd is the same as a corresponding bit (denoted by dx$_i$) of the MUX output dither signal ddx (when swap_ctrl$_i$=0), or (2) swap b$_i$ of the LSBs signal db with d$_i$ of the dither signal dd such that d$_i$ of the dither signal dd is the same as bx$_i$ of the MUX output LSBs signal dbx, and b$_i$ of the LSBs signal db is the same as dx$_i$ of the MUX output dither signal ddx (when swap_ctrl$_i$=1). Because LSB$_i$ and DIT$_i$ are equivalent, the multiplexer can swap LSB$_i$ and DIT$_i$, thereby achieving a BCTR.

Referring to FIG. 5, the BCTR controller 590 may determine whether to pass b$_i$ and d$_i$ "as is" or swap b$_i$ and d$_i$, based on a value of a pair of {b$_i$, d$_i$} as shown in Table 1. In Table 1, if the value of the pair of {b$_i$, d$_i$} is "00" or "11", the BCTR controller 590 may determine to pass b$_i$ and d$_i$ "as is" because there is no degree of freedom (e.g., no reason to swap b$_i$ and d$_i$). Thus, this case ("00" or "11") may be referred to as a "forced" (F) transition. On the other hand, if the value of the pair of {b$_i$, d$_i$} is "01" or "10", the BCTR controller 590 may determine to either pass b$_i$ and d$_i$ "as is" or swap b$_i$ and d$_i$, because there is a degree of freedom (e.g., b$_i$ and d$_i$ can be swapped based on equivalence between LSB$_i$ and DIT$_i$). Thus, this case ("01" or "01") may be referred to as a "programmable" (P) transition. In some embodiments, the BCTR controller 590 may calculate a value val$_i$ by adding the values of b$_i$ and d$_i$ and determine whether the case is a "forced" (F) transition or a "programmable" (P) transition. For example, if the value of the pair of {b$_i$, d$_i$} is "00" or "11", val$_i$ will be an even number (0 or 2) and the BCTR controller 590 may determine that these cases are F transitions because there is no degree of freedom. On the other hand, if (1) the value of the pair of {b$_i$, d$_i$} is "01" or "10" and (2) the value of the pair of {bx$_i$, dx$_i$} is "01" or "10" (e.g., both val$_i$ for {b$_i$, d$_i$} and val$_i$ for {bx$_i$, dx$_i$} are odd numbers), the BCTR controller 590 may determine that these cases are P transitions because there is a degree of freedom.

In some embodiments, if the pair of {b$_i$, d$_i$} has a degree of freedom (e.g., val$_i$=1), the BCTR controller 590 may control the multiplexer 580 to increase or decrease the binary switching or transitions (e.g., increase or decrease the number of binary transitions between "0" and "1" in LSB$_i$ and DIT$_i$) to realize a BCTR. For example, the BCTR controller 590 may reduce a deviation of the number of binary transitions in LSB$_i$ and DIT$_i$ such that the actual number of binary transitions is substantially the same as an average number of binary transition (e.g., 7 according to Equation 9) using Equation 10.

The DAC 500 can achieve a BCTR (or implement a BCTR scheme) by keeping a dither generator (e.g., dither generator 570) and a MSBs path (e.g., DEM circuitry 520 and MSBs DAC 530) as they are and just adding the multiplexer 580 and the BCTR controller 590. In this manner, the dither generator 570, the MSBs path, the multiplexer 580 and the BCTR controller 590 can operate in parallel without adding any latency, and the system aching the BCTR can be implemented in a simple, low-overhead and practical manner.

FIG. 6 is a state transition diagram 600 showing (1) transitions between pairs of a data bit and a dither bit (e.g., "00", "01", "10", "11") and (2) corresponding numbers of switching or transitions (e.g., sw$_i$), in accordance with an embodiment. A system (e.g., DAC 500) can achieve a BCTR (or implement a BCTR scheme) using state transitions between pairs of {bx$_i$, dx$_i$} as represented in the state transition diagram 600. Each {bx$_i$(n), dx$_i$(n)} pair may have 4 states (e.g., states 610, 620, 630, 640), and the transition or switching may depend on the previous state {bx$_i$(n−1), dx$_i$(n−1)}. The system may use a variable sw$_i$ denoting a number of required transitions in i$^{th}$ bits of {bx$_i$(n), dx$_i$(n)} pair. The system may set sw$_i$ to 0 if no transition occurs (e.g., "00" to "00"), set sw$_i$ to 1 if only 1 bit is switched (e.g., "00" to "10"), and set sw$_i$ to 2 if both bits are switched (e.g., "00" to "11"). There may be 16 transition possibilities 651 to 666, each of which is denoted by "$sw_i$/transition type." For example, the transition possibility 651 from "00" to "00" has $sw_i=0$ and is of "forced" transition type, and the transition possibilities 664, 665 between "01" and "10" have $sw_i=2$ and are of "programmable" transition type.

Referring to FIG. 6, out of 16 transition possibilities 651 to 666, (1) 12 transitions possibilities 651 to 662 have no degree of freedom (12 forced transitions) and (2) 4 transitions possibilities 663 to 666 (when $val_i(n)=1$ and $val_i(n-1)=1$) have a degree of freedom (4 programmable transitions). For 4 programmable transitions (when $val_i(n)=1$ and $val_i(n-1)=1$), the system may set $sw_i$ to 0 or 2 (e.g., "01" to "10"). For example, if the system sets $sw_i$ to 0 for two programmable transitions and sets $sw_i$ to 2 for the other two programmable transitions (as shown in FIG. 6), out of 16 transition possibilities, 4 transition possibilities (651, 656, 663, 666) have $sw_i=0$, 8 transition possibilities (652, 653, 654, 655, 657, 658, 659, 550) have $sw_i=1$, and 4 transition possibilities (661, 662, 664, 665) shave $sw_i=2$.

Figure 7:
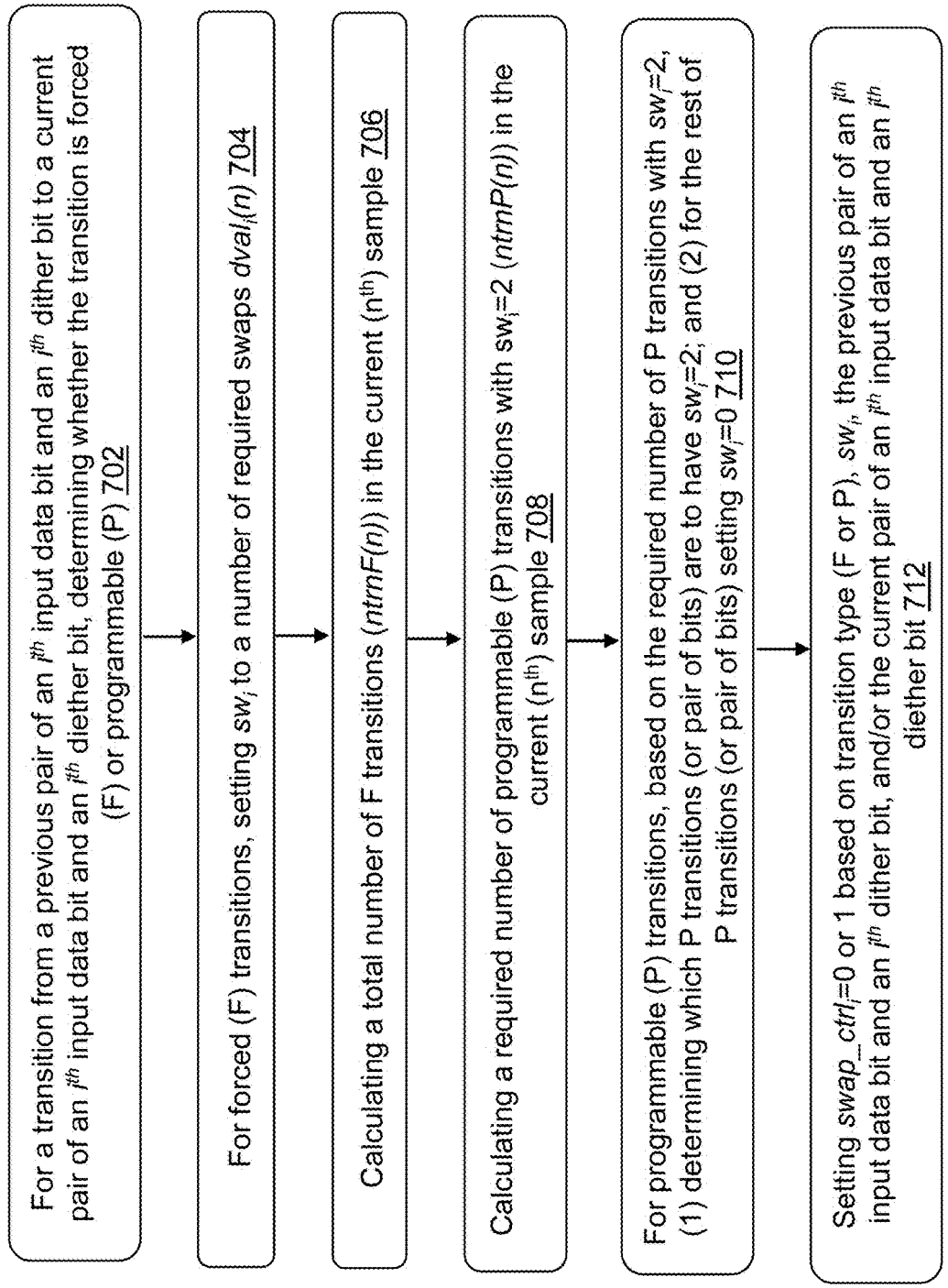
FIG. 7 is a flow diagram showing a process for determining whether to swap between input data and dither data, in accordance with an embodiment.

FIG. 7 is a flow diagram showing a process 700 for determining whether to swap between input data and dither data (e.g., to perform a BCTR scheme), in accordance with an embodiment. In some embodiments, the process 700 is performed by one or more DACs (e.g. DAC 400, DAC 500) or components of the DACs (e.g., BCTR controller 494, 590, multiplexer 492, 580). In other embodiments, the process 700 is performed by other entities. In some embodiments, the process 700 includes more, fewer, or different steps than shown in FIG. 7.

At step 702, for a transition from a previous pair of an $i^{th}$ input data bit and an $i^{th}$ dither bit $\{b_i(n-1), d_i(n-1)\}$ to a current pair of an $i^{th}$ input data bit and an $i^{th}$ dither bit $\{b_i(n), d_i(n)\}$, a system (e.g., DAC 400, DAC 500, BCTR controller 494, 590, multiplexer 492, 580) may determine whether the transition is forced (F) or programmable (P). For example, referring to Table 2, the system may determine that the transition for bit 0 is F because $val_i(n)$ is an even number (e.g., 0); and the transition for bit 1 is P because both $val_i(n)$ and $val_i(n-1)$ are odd numbers (e.g., 1).

At step 704, for forced (F) transitions, the system calculates sw, to a number of required transitions $dval_i(n)$ which can be calculated using Equation 11. For example, referring to Table 2, the system can calculate $dval_i(n)=1$ for i=0, 4, 5.

At step 706, the system may calculate a total number of F transitions (ntrnF(n)) in the current ($n^{th}$) sample using Equation 12. For example, referring to Table 2, the system can calculate ntrnF(n)=3 by summing $dval_i(n)$.

At step 708, the system may calculate a required number of programmable (P) transitions with $sw_i=2$ (ntrnP(n)) in the current ($n^{th}$) sample using Equation 13. For example, referring to Table 2, the system can calculate ntrnP(n)=(7−3)/2=2.

At step 710, for programmable (P) transitions, based on the required number of P transitions with $sw_i=2$ (ntrnP(n)), the system may (1) determine which P transitions (or pair of bits) are to have $sw_i=2$; and (2) set $sw_i=0$ for the rest of P transitions (or pair of bits). For example, referring to Table 2, based on ntrnP(n)=2, the system may determine which both P transitions for i=1, 6 are to have $sw_i=2$ (because there is no other P transitions, there is no P transitions that have $sw_i=0$). As shown in Table 2, the sum of $sw_i$ over i=0, . . . , 6 is 7, indicating that the number of binary transition is a constant (e.g., 7), thereby satisfying the BCTR condition (e.g., Equation 10).

At step 712, after the system (e.g., BCTR controller 494, 590) determines the transition type F or P and calculates $sw_i$, the system (e.g., BCTR controller 494, 590) may set swap_ctrl$_i$ (e.g., an output signal of the BCTR controller) as follows. If a transition is forced F, then the BCTR controller may set swap_ctrl$_i=0$ (regardless of $sw_i$, which can be 0, 1, or 2 as shown in FIG. 6). For example, as shown in Table 2, the BCTR controller sets swap_ctrl$_i=0$ for the transitions whose type is F. If a transition is programmable P, then the system may set swap_ctrl$_i=0$ or 1 based on $sw_i$, the current sample of MUX input $\{db_i(n), dd_i(n)\}$ and the previous sample of MUX output $\{dbx_i(n), ddx_i(n)\}$. For example, as shown in Table 2, when the previous sample is $\{0,1\}$ and the current sample is $\{0,0\}$, the BCTR controller sets swap_ctrl$_i=0$; and when the previous sample is $\{0,1\}$ and the current sample is $\{1,0\}$, the BCTR controller sets swap_ctrl$_i=1$.

In some embodiments, a method may include for a transition from a first pair of bits in first data provided to one or more digital-to-analog converters (DACs) to a second pair of bits in second data provided to a multiplexer, determining, by a controller based on the first pair of bits and the second pair of bits, whether the transition is of a first type or of a second type. The method may include in response to determining that the transition is of the first type, generating, by the controller, a first signal to control the multiplexer to output the second pair of bits to the one or more DACs. The method may include in response to determining that the transition is of the second type, determining, by the controller, whether the second pair of bits are to be swapped or not. The method may include in response to determining that the second pair of bits are to be swapped, generating, by the controller, a second signal to control the multiplexer to swap the second pair of bits and output the swapped pair of bits to the one or more DACs. Data output by the multiplexer based on the second data may have a predetermined number of bits that have binary values different from those of corresponding bits in the first data.

In some embodiments, in determining whether the transition is of a first type or of a second type, the controller may determine a first number of bits that have a binary value "1" among the first pair of bits, and determine a second number of bits that have a binary value "1" among the second pair of bits. In response to determining that the first number is odd and the second number is odd, the controller may determine that the transition is of the second type. In response to determining that at least one of the first number or the second number is even, the controller may determine that the transition is of the first type.

In some embodiments, in response to determining that the transition is of the first type, the controller may determine a number of binary transitions from the first pair of bits to the second pair of bits. The number of binary transitions is a number of bits of the second pair of bits that have binary values different from those of corresponding bits of the first pair of bits.

In some embodiments, for each of a plurality of transitions from respective pairs of bits in the first data to respective pairs of bits in the second data, the controller may determine whether each transition is of the first type or of the second type. In response to determining that each transition is of the first type, the controller may determine a respective number of binary transitions for each transition. The number of binary transitions may be a number of bits of the second pair of bits that have binary values different from those of corresponding bits of the first pair of bits. The controller may determine a total number of binary transitions for the first type by summing the respective numbers of binary transitions. The controller may determine a total number of swaps for the second type based on the total number of binary transitions for the first type.

In determining whether the second pair of bits are to be swapped or not, in response to determining that each transition is of the second type, the controller may determine whether each transition is swapped or not such that a number of transitions determined to be swapped among the plurality of transitions equals the total number of swaps for the second type. The controller may reduce switching noise on driver circuitry of the one or more DACs by reducing a number of binary transitions from the first data to the data output by the multiplexer, to the predetermined number of bits.

Figures 8A, 8B:
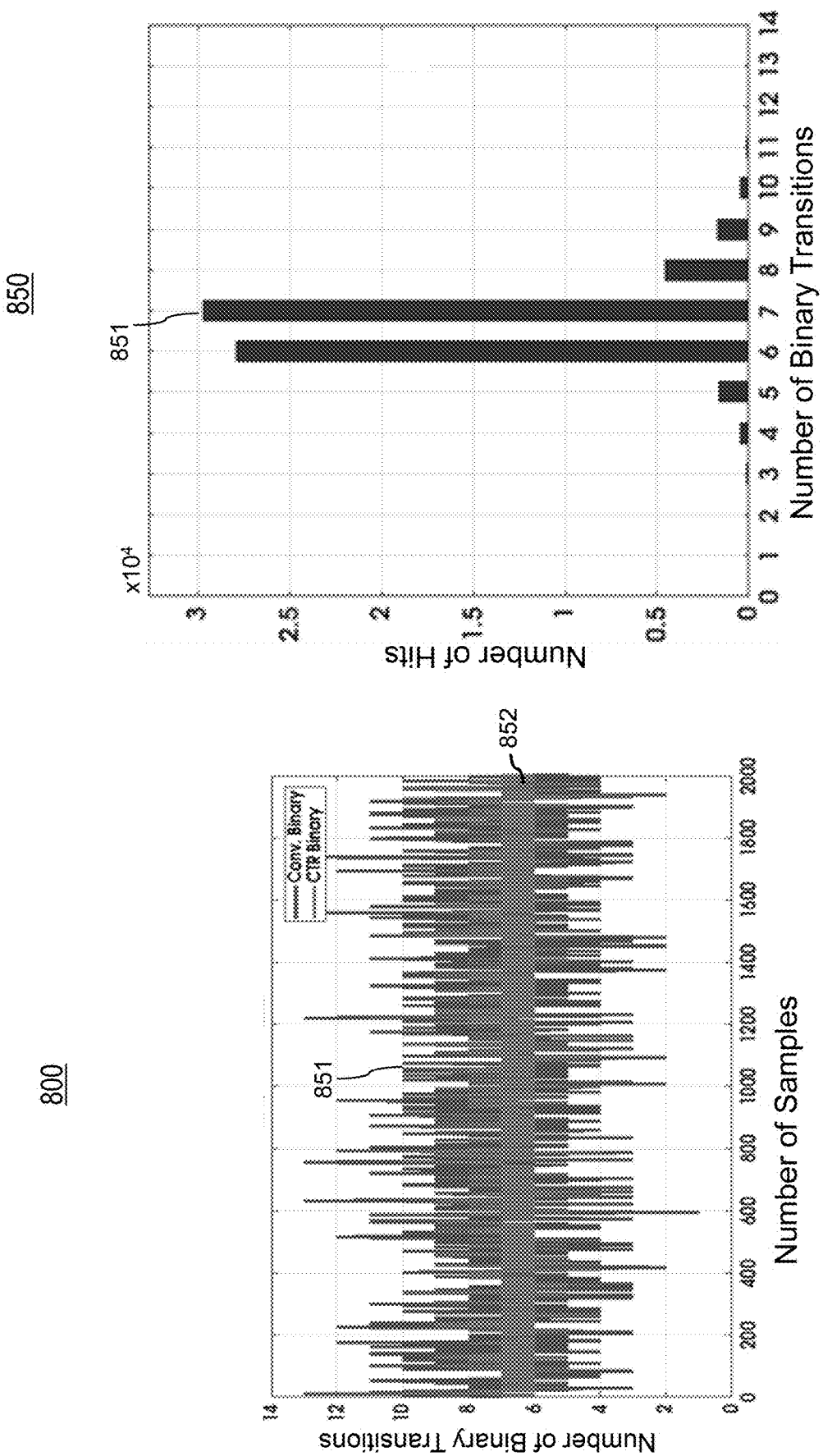
FIG. 8A and FIG. 8B are diagrams showing binary transition rates, in accordance with an embodiment.

FIG. 8A and FIG. 8B are diagrams showing binary transition rates (e.g., number of binary transitions per sample), in accordance with an embodiment. FIG. 8A shows (1) the number of binary transitions (NtrnB) 851 over different samples using a DAC configured to randomize LSBs signals using dither signals (e.g., DAC 200 in FIG. 2); and (2) the number of binary transitions (NtrnB) 852 over different samples using a DAC configured to perform a BCTR scheme (e.g., DAC 400 in FIG. 4, DAC 500 in FIG. 5). FIG. 8B shows the number of hits (frequency) 851 over different numbers of binary transitions (NtrnB) using the DAC configured to perform a BCTR scheme (e.g., DAC 400 in FIG. 4, DAC 500 in FIG. 5).

FIG. 8A and FIG. 8B show that in DAC 200, the average of the number of binary transitions ($\mu_{NtrnB}$) and the standard deviation of the number of binary transitions ($\sigma_{NtrnB}$) are 7.01 and 1.87, respectively, while in DAC 400 or 500, the average of the number of binary transitions ($\mu_{NtrnB}$) and the standard deviation of the number of binary transitions ($\sigma_{NtrnB}$) are 6.65 and 0.859, respectively. That is, the DAC 400 or 500 can reduce $\sigma_{NtrnB}$ by up to 2.2 times compared to DAC 200. In some embodiments, if two bits are added to LSBs signals and dither signals for dummy switching, the system can remove the tails (in FIG. 8B) completely and further reduce $\sigma_{NtrnB}$.

Figure 9:
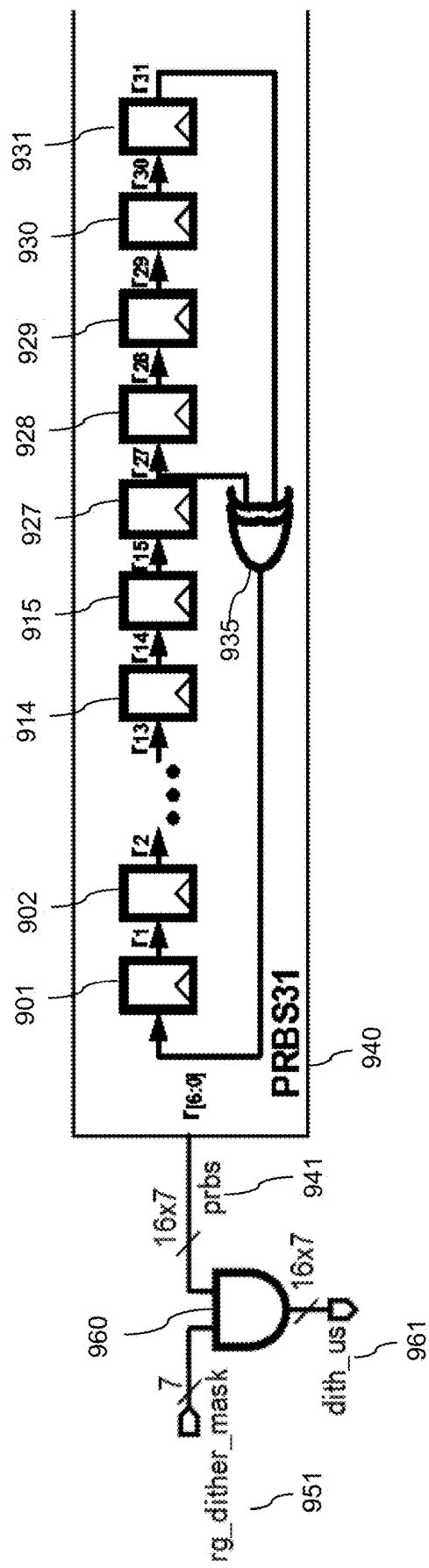
FIG. 9 is a schematic block diagram of an example dither generator, according to an embodiment.

FIG. 9 is a schematic block diagram of an example dither generator 900, according to an embodiment. The dither generator 900 may include a pseudorandom binary sequence generator 940 (e.g., PRBS31 generator) to generate a binary dither signal. The PRBS31 generator 940 may include 31 shift registers 901 to 931 and an XOR gate 935 which XORing taps 28 and 31. The dither generator 900 may include an AND gate 960 which receive a dither mask signal 951 (or using a dither mask register) and a dither signal 941 (received from the PRBS31 generator 940) and output a masked dither signal 961.

Figure 10:
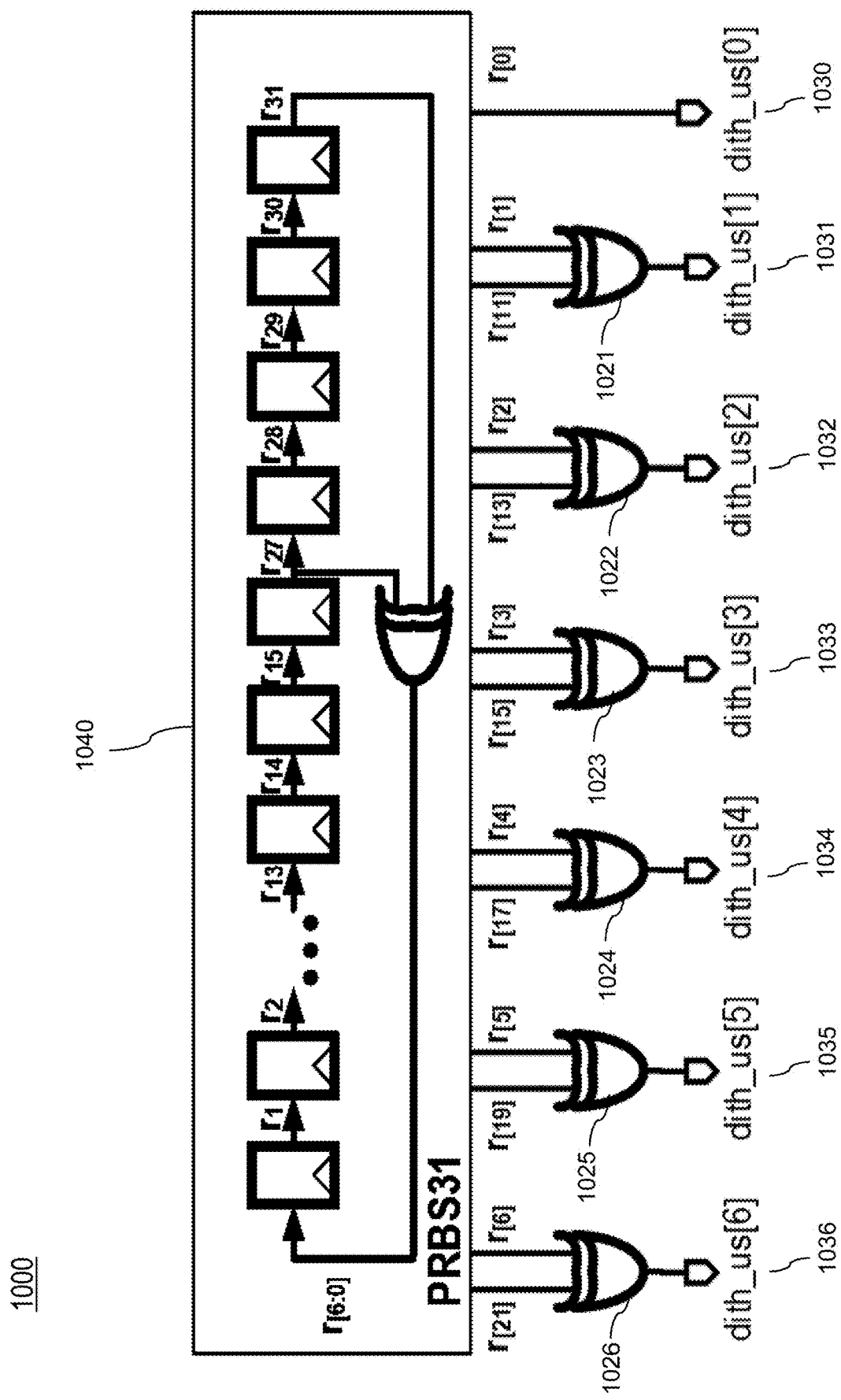
FIG. 10 is a schematic block diagram of another example dither generator, according to an embodiment.

FIG. 10 is a schematic block diagram of another example dither generator 1000, according to an embodiment. The dither generator may include a pseudorandom binary sequence generator (e.g., PRBS31 generator having a configuration similar to the PRBS31 generator 940) and a plurality of XOR gates 1021 to 1026. Each bit of an output signal (e.g., bits [1:6] 1031 to 1036) may be generated from XORing two taps from the PRBS31 generator with different spacing. For example, bit[6] 1036 may be generated from XORing taps 6 and 21, while bit[1] 1031 may be generated from XORing taps 1 and 11. The first bit (bit[0]) may be the same as the tap 0. In this manner, the dither generator can remove any cross-correlation while keeping the properties of the pseudorandom binary sequence generator as shown in FIG. 11A and FIG. 11B.

Figure 11B:
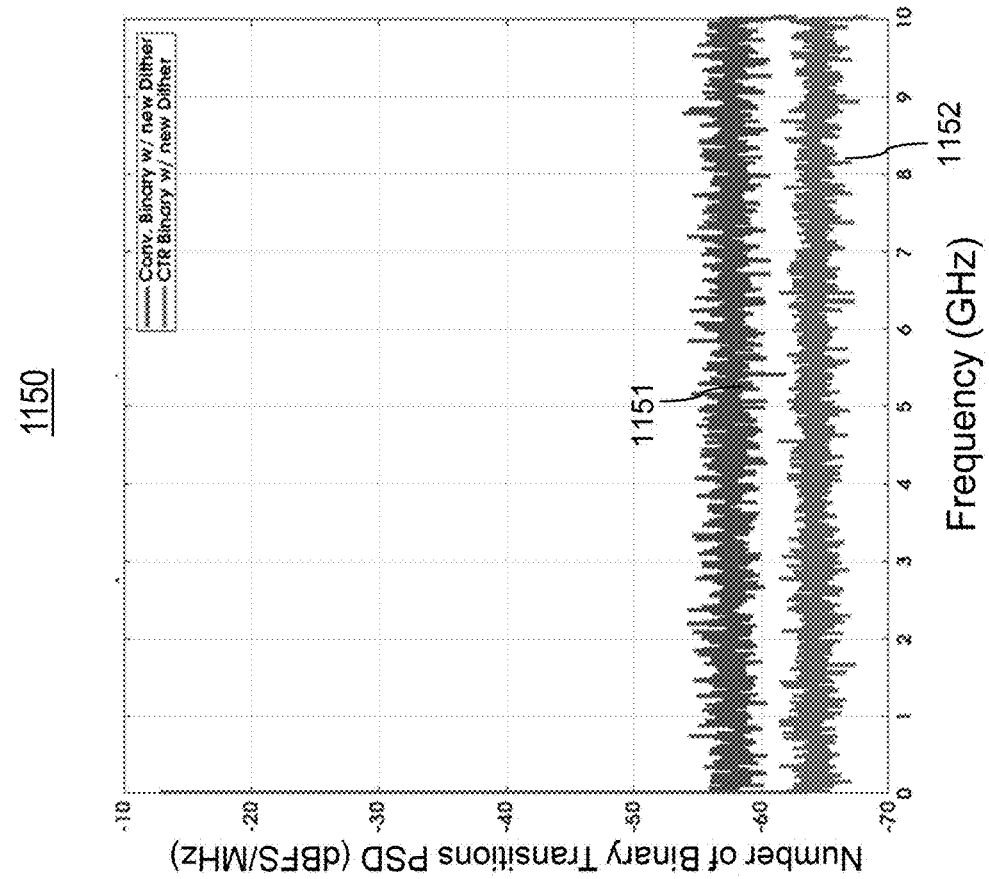
FIG. 11A and FIG. 11B are diagrams showing power spectral density (PSD) of binary transition numbers, in accordance with an embodiment.
Figure 11A:
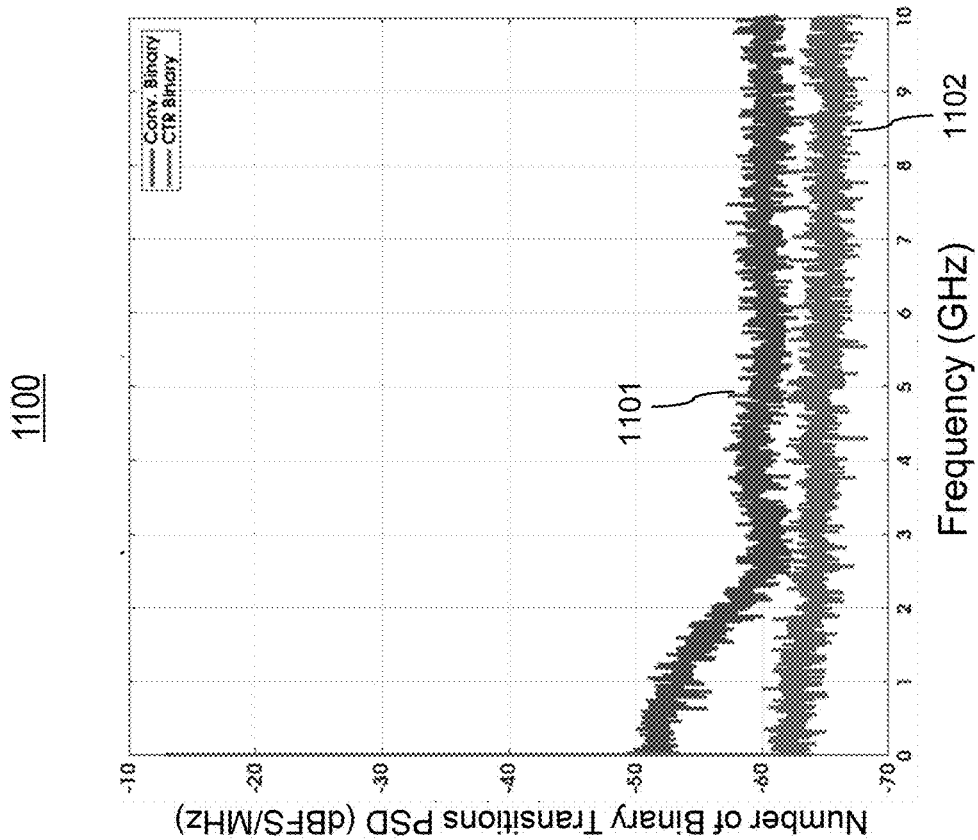

FIG. 11A and FIG. 11B are diagrams showing power spectral density (PSD) of binary transition numbers, in accordance with an embodiment. FIG. 11A shows (1) the number of binary transitions PSD 1101 over different frequencies using a DAC configured to randomize LSBs signals using a dither generator in FIG. 9 (e.g., DAC 200 with dither generator 900); and (2) the number of binary transitions PSD 1102 over different frequencies using a DAC configured to perform a BCTR scheme using a dither generator in FIG. 9 (e.g., DAC 400 or 500 with dither generator 900). FIG. 11B shows (1) the number of binary transitions PSD 1151 over different frequencies using a DAC configured to randomize LSBs signals using a dither generator in FIG. 10 (e.g., DAC 200 with dither generator 1000); and (2) the number of binary transitions PSD 1152 over different frequencies using a DAC configured to perform a BCTR scheme using a dither generator in FIG. 10 (e.g., DAC 400 or 500 with dither generator 1000). FIG. 11A and FIG. 11B show that by using the dither generator 1000 (which XORs two taps from the PRBS31 generator with different spacing), (1) cross-correlations (e.g., leftmost portion of the PSD 1101 and the PSD 1102 in FIG. 11A) can be removed (see FIG. 11B); (2) the close-in noise can be reduced up to 11 dB; and (3) the noise floor can be reduced up to 5 dB.

Figure 12:
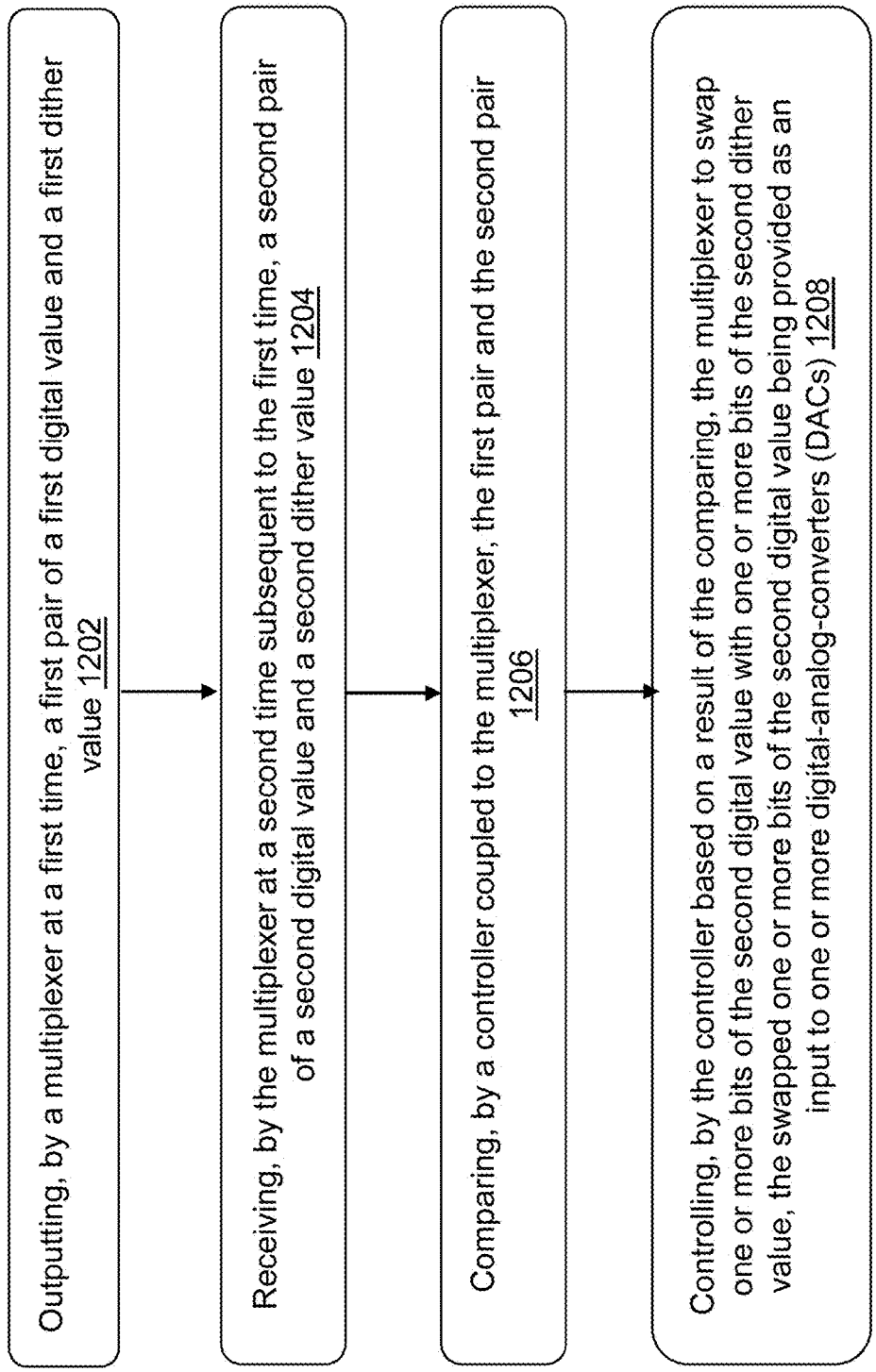
FIG. 12 is a flow diagram showing a process for executing binary switching in one or more DACs, in accordance with an embodiment.

FIG. 12 is a flow diagram showing a process 1200 for executing binary switching in one or more DACs, in accordance with an embodiment. In some embodiments, the process 1200 is performed by one or more DACs (e.g. DAC 400, DAC 500) or components of the DACs (e.g., BCTR controller 494, 590, multiplexer 492, 580). In other embodiments, the process 1200 is performed by other entities. In some embodiments, the process 1200 includes more, fewer, or different steps than shown in FIG. 12.

At step 1202, a system (e.g., DAC 400, DAC 500) may output, by a multiplexer (e.g., multiplexer 492, 580) at a first time (e.g., a time at which the system receives an $(n-1)^{th}$ sample), a first pair of a first digital value and a first dither value (e.g., $\{b_i(n-1), d_i(n-1)\}$, i=0, ..., 6).

At step 1204, the system may receive, by the multiplexer at a second time subsequent to the first time (e.g., a time at which the system receives an $n^{th}$ sample), a second pair of a second digital value and a second dither value (e.g., $\{b_i(n), d_i(n)\}$, i=0, ..., 6). In some embodiments, the second dither value (e.g., $d_i(n)$, i=0, ..., 6) may be randomly generated (e.g., by dither generator 490, 570, 900, 1000). The system may receive input data (e.g., din[n] 411, data signal 511). The system may generate the second digital value $b_i(n)$ by subtracting the second dither value from the input data.

At step 1206, the system may compare, by a controller (e.g., BCTR controller 494, 590) coupled to the multiplexer, the first pair (e.g., $\{b_i(n-1), d_i(n-1)\}$, i=0, ..., 6) and the second pair (e.g., $\{b_i(n), d_i(n)\}$, i=0, ..., 6). In some embodiments, in comparing the first pair and the second pair, the controller may compare, for each bit of a plurality of bits of the second digital value (e.g., $b_i(n)$), a first value and a second value as a second comparison. The first value may include a binary value of the first digital value $b_i(n-1)$ and a binary value of the first dither value $d_i(n-1)$ that correspond to said each bit. The second value may include a binary value of the second digital value $b_i(n)$ and a binary value of the second dither value $d_i(n)$ that correspond to said each bit. The controller may determine, based on a result of the second comparison, among the plurality of bits of the second digital value (e.g., $b_i(n)$, i=0, ..., 6), a group of bits of the second digital value that are optionally to be swapped with corresponding bits of the second dither value (e.g., the group of bits belongs to "programmable" transitions). The controller may determine, based on the result of the second comparison and a predetermined quantity (e.g., 7 in Equation 13), among the group of bits of the second digital value, a first quantity (e.g., ntrnP(n)=number of programmable transitions with $sw_i=2$) of one or more bits that are to be swapped with one or more bits of the second dither value (e.g., using Equation 13).

In some embodiments, the controller may determine, based on the first quantity (e.g., ntrnP(n)), the one or more bits of the second digital value swapped with the one or more bits of the second dither value (e.g., which P transitions (or pair of bits) are to have $sw_i=2$). The predetermined quantity (e.g., 7 in Equation 13) may be equal to the number of the plurality of bits of the second digital value (e.g., $N_B$ or $N_D$). The controller may determine the one or more bits of the second digital value swapped with the one or more bits of the second dither value (e.g., which P transitions (or pair of bits) are to have $sw_i=2$) by randomly selecting, from among the group of bits of the second digital value, one or more bits according to the first quantity (e.g., randomly selecting ntrnP(n) number of bits among the bits that belong to programmable transitions).

At step 1208, the system may control, by the controller based on a result of the comparing. the multiplexer to swap one or more bits of the second digital value with one or more bits of the second dither value. The swapped one or more bits of the second digital value (e.g., swapped $b_i(n)$) may be provided as an input to one or more DACs (e.g., dither DAC 450, 550). In some embodiments, the swapped one or more bits of the second dither value (e.g., swapped $d_i(n)$) may be provided as an input to one or more DACs (e.g., LSBs DAC 440, 540) that are different from the one or more DACs (e.g., dither DAC 450, 550) to which the swapped one or more bits of the second digital value (e.g., swapped $b_i(n)$) are provided.

The term "coupled" and variations thereof includes the joining of two members directly or indirectly to one another. The term "communicatively coupled" and variations thereof may include communicatively coupling between two members directly or indirectly. Such communication or communicatively coupling may be achieved by a first member being in direct communication with or directly coupled to a second member, or achieved with additional members that may intervene between the first and second members, such that the first member is in indirect communication with or indirectly coupled to the second member via the additional members.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of buffers, hosts, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A method comprising:
for a transition from a first pair of bits in first data provided to one or more digital-to-analog converters (DACs) to a second pair of bits in second data provided to a multiplexer, determining, by a controller based on the first pair of bits and the second pair of bits, whether the transition is of a first type or of a second type;
in response to determining that the transition is of the first type, generating, by the controller, a first signal to control the multiplexer to output the second pair of bits to the one or more DACs;
in response to determining that the transition is of the second type, determining, by the controller, whether the second pair of bits are to be swapped or not; and
in response to determining that the second pair of bits are to be swapped, generating, by the controller, a second signal to control the multiplexer to swap the second pair of bits and output the swapped pair of bits to the one or more DACs,
wherein data output by the multiplexer based on the second data has a predetermined number of bits that have binary values different from those of corresponding bits in the first data.

2. The method according to claim 1, wherein determining whether the transition is of a first type or of a second type comprises:
determining a first number of bits that have a binary value "1" among the first pair of bits;
determining a second number of bits that have a binary value "1" among the second pair of bits;
in response to determining that the first number is odd and the second number is odd, determining that the transition is of the second type; and
in response to determining that at least one of the first number or the second number is even, determining that the transition is of the first type.

3. The method according to claim 1, further comprising:
in response to determining that the transition is of the first type, determining a number of binary transitions from the first pair of bits to the second pair of bits, wherein the number of binary transitions is a number of bits of the second pair of bits that have binary values different from those of corresponding bits of the first pair of bits.

4. The method according to claim 1, further comprising:
for each of a plurality of transitions from respective pairs of bits in the first data to respective pairs of bits in the second data, determining whether each transition is of the first type or of the second type;
in response to determining that each transition is of the first type, determining a respective number of binary transitions for each transition, wherein the number of binary transitions is a number of bits of the second pair of bits that have binary values different from those of corresponding bits of the first pair of bits; and
determining a total number of binary transitions for the first type by summing the respective numbers of binary transitions.

5. The method according to claim 4, further comprising:
determining a total number of swaps for the second type based on the total number of binary transitions for the first type.

6. The method according to claim 5, wherein determining whether the second pair of bits are to be swapped or not comprises:
in response to determining that each transition is of the second type, determining whether each transition is swapped or not such that a number of transitions determined to be swapped among the plurality of transitions equals the total number of swaps for the second type.

7. The method according to claim 1, further comprising:
reducing switching noise on driver circuitry of the one or more DACs by reducing a number of binary transitions from the first data to the data output by the multiplexer, to the predetermined number of bits.

8. A system comprising:
a multiplexer configured to
output, at a first time, a first pair of a first digital value and a first dither value;
receive, at a second time subsequent to the first time, a second pair of a second digital value and a second dither value;
a controller coupled to the multiplexer and configured to:
compare the first pair and the second pair; and
control, based on a result of the comparing, the multiplexer to swap one or more bits of the second digital value with one or more bits of the second dither value, the swapped one or more bits of the second digital value being provided as an input to one or more digital-analog-converters (DACs).

9. The system according to claim 8, wherein the swapped one or more bits of the second dither value are provided as an input to one or more DACs that are different from the one or more DACs to which the swapped one or more bits of the second digital value are provided.

10. The system according to claim 8, wherein in comparing the first pair and the second pair, the controller is configured to:
compare, for each bit of a plurality of bits of the second digital value, a first value and a second value as a second comparison, the first value comprising a binary value of the first digital value and a binary value of the first dither value that correspond to said each bit, the second value comprising a binary value of the second digital value and a binary value of the second dither value that correspond to said each bit;
determine, based on a result of the second comparison, among the plurality of bits of the second digital value, a group of bits of the second digital value that are optionally to be swapped with corresponding bits of the second dither value; and
determine, based on the result of the second comparison and a predetermined quantity, among the group of bits of the second digital value, a first quantity of one or more bits that are to be swapped with one or more bits of the second dither value.

11. The system according to claim 10, wherein the controller is configured to:
determine, based on the first quantity, the one or more bits of the second digital value swapped with the one or more bits of the second dither value.

12. The system according to claim 10, wherein the predetermined quantity is equal to the number of the plurality of bits of the second digital value.

13. The system according to claim 10, wherein the controller is configured to:
determine the one or more bits of the second digital value swapped with the one or more bits of the second dither value by randomly selecting, from among the group of bits of the second digital value, one or more bits according to the first quantity.

14. The system according to claim 8, further comprising:
first circuitry configured to randomly generate the second dither value; and
second circuitry configured to
receive input data, and
generate the second digital value by subtracting the second dither value from the input data.

15. A device comprising:
circuitry coupled to a first plurality of digital-analog-converters (DACs) and configured to perform a dynamic element matching logic to output a unary code to the first plurality of DACs;
a multiplexer coupled to a second plurality of DACs; and
a controller coupled to the multiplexer and configured to:
for a transition from a first pair of bits in first data provided to the second plurality of DACs to a second pair of bits in second data provided to the multiplexer,
determine, based on the first pair of bits and the second pair of bits, whether the transition is of a first type or of a second type;
in response to determining that the transition is of the first type, generate a first signal to control the multiplexer to output the second pair of bits to the one or more DACs;
in response to determining that the transition is of the second type, determine whether the second pair of bits are to be swapped or not; and
in response to determining that the second pair of bits are to be swapped, generate a second signal to control the multiplexer to swap the second pair of bits and output the swapped pair of bits to the one or more DACs,
wherein data output by the multiplexer based on the second data has a predetermined number of bits that have binary values different from those of corresponding bits in the first data.

16. The device according to claim 15, wherein in determining whether the transition is of a first type or of a second type, the controller is configured to:
determine a first number of bits that have a binary value "1" among the first pair of bits;
determine a second number of bits that have a binary value "1" among the second pair of bits;

in response to determining that the first number is odd and the second number is odd, determine that the transition is of the second type; and in response to determining that at least one of the first number or the second number is even, determine that the transition is of the first type.

17. The device according to claim 15, the controller is further configured to:

in response to determining that the transition is of the first type, determine a number of binary transitions from the first pair of bits to the second pair of bits, wherein the number of binary transitions is a number of bits of the second pair of bits that have binary values different from those of corresponding bits of the first pair of bits.

18. The device according to claim 15, the controller is further configured to:

for each of a plurality of transitions from respective pairs of bits in the first data to respective pairs of bits in the second data, determine whether each transition is of the first type or of the second type;

in response to determining that each transition is of the first type, determine a respective number of binary transitions for each transition, wherein the number of binary transitions is a number of bits of the second pair of bits that have binary values different from those of corresponding bits of the first pair of bits; and determine a total number of binary transitions for the first type by summing the respective numbers of binary transitions.

19. The device according to claim 18, the controller is further configured to:

determine a total number of swaps for the second type based on the total number of binary transitions for the first type.

20. The device according to claim 19, wherein in determining whether the second pair of bits are to be swapped or not, the controller is configured to:

in response to determining that each transition is of the second type, determine whether each transition is swapped or not such that a number of transitions determined to be swapped among the plurality of transitions equals the total number of swaps for the second type.

* * * * *